(12) United States Patent
Song et al.

(10) Patent No.: US 12,707,804 B2
(45) Date of Patent: Aug. 11, 2026

(54) DISPLAY PANEL AND ELECTRONIC APPARATUS INCLUDING THE SAME

(71) Applicant: Samsung Display Co., Ltd., Yongin-si (KR)

(72) Inventors: Ilha Song, Yongin-si (KR); Hyomin Ko, Yongin-si (KR); Sang Gyun Kim, Yongin-si (KR); Hyeongpil Kim, Yongin-si (KR); Bora Lee, Yongin-si (KR); Hyeonmi Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 299 days.

(21) Appl. No.: 18/365,128

(22) Filed: Aug. 3, 2023

(65) Prior Publication Data

US 2024/0179937 A1 May 30, 2024

(30) Foreign Application Priority Data

Nov. 28, 2022 (KR) ........................ 10-2022-0161932

(51) Int. Cl.
*H10K 50/19* (2023.01)
*H10K 59/122* (2023.01)
(Continued)

(52) U.S. Cl.
CPC ........... *H10K 50/19* (2023.02); *H10K 59/122* (2023.02); *H10K 59/38* (2023.02); *H10K 59/80517* (2023.02); *H10K 2102/351* (2023.02)

(58) Field of Classification Search
CPC ...... H10K 50/19; H10K 50/13; H10K 50/131; H10K 50/852; H10K 50/15; H10K 50/16;
(Continued)

(56) References Cited

U.S. PATENT DOCUMENTS 6,133,692 A 10/2000 Xu et al.
8,471,275 B2 6/2013 Lee et al.
(Continued)

FOREIGN PATENT DOCUMENTS

CN 112599689 A 4/2021
CN 115394938 A 11/2022
(Continued)

OTHER PUBLICATIONS

JP2009049223A Machine translation (Year: 2009).*
(Continued)

*Primary Examiner* — Anne M Hines
*Assistant Examiner* — Jose M Diaz
(74) *Attorney, Agent, or Firm* — Womble Bond Dickinson (US) LLP

(57) ABSTRACT

A display panel includes a circuit layer and a display element layer that includes light emitting elements emitting white light, wherein the light emitting elements each include a first electrode, an optical auxiliary layer on the first electrode, a conductive layer on the optical auxiliary layer, a hole transport region on the conductive layer, a first light emitting layer on the hole transport region and emitting first light, a light emitting auxiliary unit on the first light emitting layer, a second light emitting layer on the light emitting auxiliary unit and generating second light, a third light emitting layer either between the first light emitting layer and the light emitting auxiliary unit or between the light emitting auxiliary unit and the second light emitting layer and generating third light, an electron transport region on the second light emitting layer, and a second electrode on the electron transport region.

19 Claims, 13 Drawing Sheets

(51) Int. Cl.

| | |
|---|---|
| ***H10K 59/38*** | (2023.01) |
| ***H10K 59/80*** | (2023.01) |
| ***H10K 102/00*** | (2023.01) |

(58) Field of Classification Search

CPC ...... H10K 50/81; H10K 50/82; H10K 50/858; H10K 59/122; H10K 59/38; H10K 59/80517; H10K 59/32; H10K 59/35; H10K 59/876; H10K 59/80518; H10K 59/121; H10K 2102/351

See application file for complete search history.

(56) References Cited

U.S. PATENT DOCUMENTS

| | | | |
|---|---|---|---|
| 9,502,677 | B2 | 11/2016 | Heo et al. |
| 11,233,093 | B2 | 1/2022 | Choi et al. |
| 11,289,669 | B2 | 3/2022 | Yang et al. |
| 2016/0133878 | A1 | 5/2016 | Uesaka et al. |
| 2016/0240588 | A1 | 8/2016 | Yi |
| 2019/0006627 | A1 | 1/2019 | Li et al. |
| 2020/0212346 | A1 | 7/2020 | Lee |
| 2021/0020868 | A1 | 1/2021 | Ikeda et al. |
| 2021/0159462 | A1 | 5/2021 | Hamer et al. |
| 2021/0199972 | A1 | 7/2021 | Joung et al. |
| 2023/0320179 | A1 | 10/2023 | Ichikawa |

FOREIGN PATENT DOCUMENTS

| | | | |
|---|---|---|---|
| JP | 2003123987 | A | 4/2003 |
| JP | 2009049223 | A | 3/2009 |
| JP | 2011076799 | A | 4/2011 |
| KR | 10-0968886 | B1 | 7/2010 |
| KR | 10-1182442 | B1 | 9/2012 |
| KR | 10-2020-0001045 | A | 1/2020 |
| KR | 10-2020-0009865 | A | 1/2020 |
| KR | 10-2021-0086336 | A | 7/2021 |
| KR | 10-2366022 | B1 | 2/2022 |
| WO | WO 2022/064891 | A1 | 3/2022 |

OTHER PUBLICATIONS

Extended European Search Report dated Apr. 24, 2024 issued in corresponding Application No. 23212603.7-1211, 11 pages.

Jang Jo et al., OLED Microdisplays for AR/VR Applications: Technical Approaches Toward Realization of over 10,000 Nits Full-Color Panels, SDI, vol. 53, Issue1 ,Jun. 2022, pp. 287-290.

* cited by examiner

LS
LS1
LS2
FP
MF
LS2
LS1
DP
EA
CF
DR3
DR2
DR1

DP
OC
TFE
P_OH
PDL
DP-ED
DP-CL
BS
I
I'
NPXA
PXA-1
PXA-2
PXA-3
CF1
CF2
CF3
CPL
EL1-1
EL1-2
EL1-3
S-OAL1
S-OAL2
S-OAL3
S-CDL1
S-CDL2
S-CDL3
EP
EL2
ED-1
ED-2
ED-3
DR3
CF1 CF2 CF3 CFL
ED-1 ED-2 ED-3 ED
EL1-1 EL1-2 EL1-3 EL1
S-OAL1 S-OAL2 S-OAL3 OAL
S-CDL1 S-CDL2 S-CDL3 CDL

DISPLAY PANEL AND ELECTRONIC APPARATUS INCLUDING THE SAME

CROSS-REFERENCE TO RELATED APPLICATIONS

This application claims priority to and the benefit of Korean Patent Application No. 10-2022-0161932, filed on Nov. 28, 2022, in the Korean Intellectual Property Office, the entire content of which is hereby incorporated by reference.

BACKGROUND

One or more embodiments of the present disclosure herein relate to a display panel including a plurality of light emitting layers, and an electronic apparatus including the display panel.

Various electronic apparatuses that may be worn on a body are being developed and commercialized, and such apparatuses are commonly referred to as wearable electronic apparatuses. Wearable electronic apparatuses may have one or more suitable forms that may be attached to or detached from a part of a human body or clothing. An example of wearable electronic apparatuses is an apparatus that can be mounted on a user's head, which may be called, for example, a head-mounted device (HMD). An apparatus such as an HMD is disposed at a short distance from a user, and thus requires a method for solving (or overcoming) a screen door effect (SDE) in which lines dividing pixels are visually recognized by the user.

SUMMARY

One or more aspects of embodiments of the present disclosure are directed toward a display panel with improved display efficiency and display lifespan, and toward an electronic apparatus including the display panel.

Additional aspects will be set forth in part in the description which follows and, in part, will be apparent from the description, or may be learned by practice of the presented embodiments.

According to one or more embodiments of the present disclosure, a display panel may include a circuit layer, a pixel definition film on the circuit layer, and a display element layer including first to third (e.g., first, second, and third) light emitting elements divided by the pixel definition film and configured to emit white light (e.g., combined white light), wherein each of the first to the third light emitting elements may include a first electrode, an optical auxiliary layer on the first electrode, a conductive layer on the optical auxiliary layer, a hole transport region on the conductive layer, a first light emitting layer on the hole transport region and configured to emit first light, a light emitting auxiliary unit on the first light emitting layer, a second light emitting layer on the light emitting auxiliary unit and configured to generate second light different from the first light, a third light emitting layer either between the first light emitting layer and the light emitting auxiliary unit or between the light emitting auxiliary unit and the second light emitting layer and configured to generate third light different from each of the first light and the second light, an electron transport region on the second light emitting layer, and a second electrode on the electron transport region.

In one or more embodiments, the optical auxiliary layer included in each of the first to the third light emitting elements may have the same thickness.

In one or more embodiments, the optical auxiliary layer may include at least one of silicon oxide, silicon oxynitride, or silicon nitride.

In one or more embodiments, the thickness of the optical auxiliary layer may be about 150 nm to about 200 nm.

In one or more embodiments, the conductive layer may cover the optical auxiliary layer, and the conductive layer may be in contact with an upper surface (e.g., a first surface) of the first electrode.

In one or more embodiments, the sum of thicknesses of the conductive layer, the hole transport region, the light emitting auxiliary unit, and the electron transport region may be about 50 nm to about 250 nm.

In one or more embodiments, a (any one) light selected from among the first light to the third light may perform a sixth-order resonance, another light thereof may perform a fourth-order resonance, and another light (the remainder) thereof may perform a third-order resonance.

In one or more embodiments, the pixel definition film may be spaced (apart) from the first electrode, and may be formed (e.g., composed) of the same material as a material of which the optical auxiliary layer is formed (e.g., composed).

In one or more embodiments, the hole transport region may be provided as a single layer, and the circuit layer may include an exposed portion exposed from the first electrode and from the pixel definition film adjacent to the first electrode, wherein the hole transport region may be in contact with the exposed portion.

In one or more embodiments, the display panel may further include a color filter layer including a first filter overlapping the first light emitting element, a second filter overlapping the second light emitting element, and a third filter overlapping the third light emitting element, and on the display element layer, wherein the first filter may be to transmit red light, the second filter may be to transmit green light, and the third filter may be to transmit blue light.

In one or more embodiments, the first light may be blue light, the second light may be red light, and the third light may be green light.

In one or more embodiments, one selected from among the first light and the third light may be red light, and the other one thereof may be green light, and the second light may be blue light.

According to one or more embodiments of the present disclosure, an electronic apparatus may include a display panel and a lens unit facing the display panel, wherein the display panel may include a circuit layer and a display element layer on the circuit layer, wherein the display element layer may include a pixel definition film on the circuit layer, and first to third (e.g., first, second, and third) light emitting elements divided by the pixel definition film and configured to emit white light (e.g., combined white light), wherein each of the first to the third light emitting elements may include a first electrode, an optical auxiliary layer on the first electrode, a conductive layer on the optical auxiliary layer, a hole transport region on the conductive layer, a first light emitting layer on the hole transport region and configured to emit first light, a light emitting auxiliary unit on the first light emitting layer, a second light emitting layer on the light emitting auxiliary unit and configured to generate second light different from the first light, a third light emitting layer either between the first light emitting layer and the light emitting auxiliary unit or between the light emitting auxiliary unit and the second light emitting layer and configured to generate third light different from each of the first light and the second light, an electron transport region on the second light emitting layer, and a second electrode on the electron transport region.

In one or more embodiments, the optical auxiliary layer included in each of the first to the third light emitting elements may have the same thickness.

In one or more embodiments, the optical auxiliary layer may include at least one of silicon oxide, silicon oxynitride, or silicon nitride.

In one or more embodiments, a thickness of the optical auxiliary layer may be about 150 nm to about 200 nm.

In one or more embodiments, the first light may perform a sixth-order resonance, the second light may perform a fourth-order resonance, and the third light may perform a third-order resonance.

In one or more embodiments, the pixel definition film may be spaced (apart) from the first electrode, and may be formed (e.g., composed) of the same material as a material of which the optical auxiliary layer is formed (e.g., composed).

In one or more embodiments, the hole transport region may be provided as a single layer, and the circuit layer may include an exposed portion exposed from the first electrode and from the pixel definition film adjacent to the first electrode, wherein the hole transport region may be in contact with the exposed portion.

In one or more embodiments, the display panel may further include a color filter layer including a first filter overlapping the first light emitting element, a second filter overlapping the second light emitting element, and a third filter overlapping the third light emitting element, and on the display element layer, wherein the first filter may be to transmit red light, the second filter may be to transmit green light, and the third filter may be to transmit blue light.

In one or more embodiments, the first light may be blue light, the second light may be red light, and the third light may be a green light.

In one or more embodiments, one of the first light and the third light may be red light, and the other one thereof may be green light, and the second light may be blue light.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. Above and/or other aspects of the present disclosure should become apparent and appreciated from the following description of embodiments taken in conjunction with the accompanying drawings. In the drawings.

DETAILED DESCRIPTION

Figure 1:
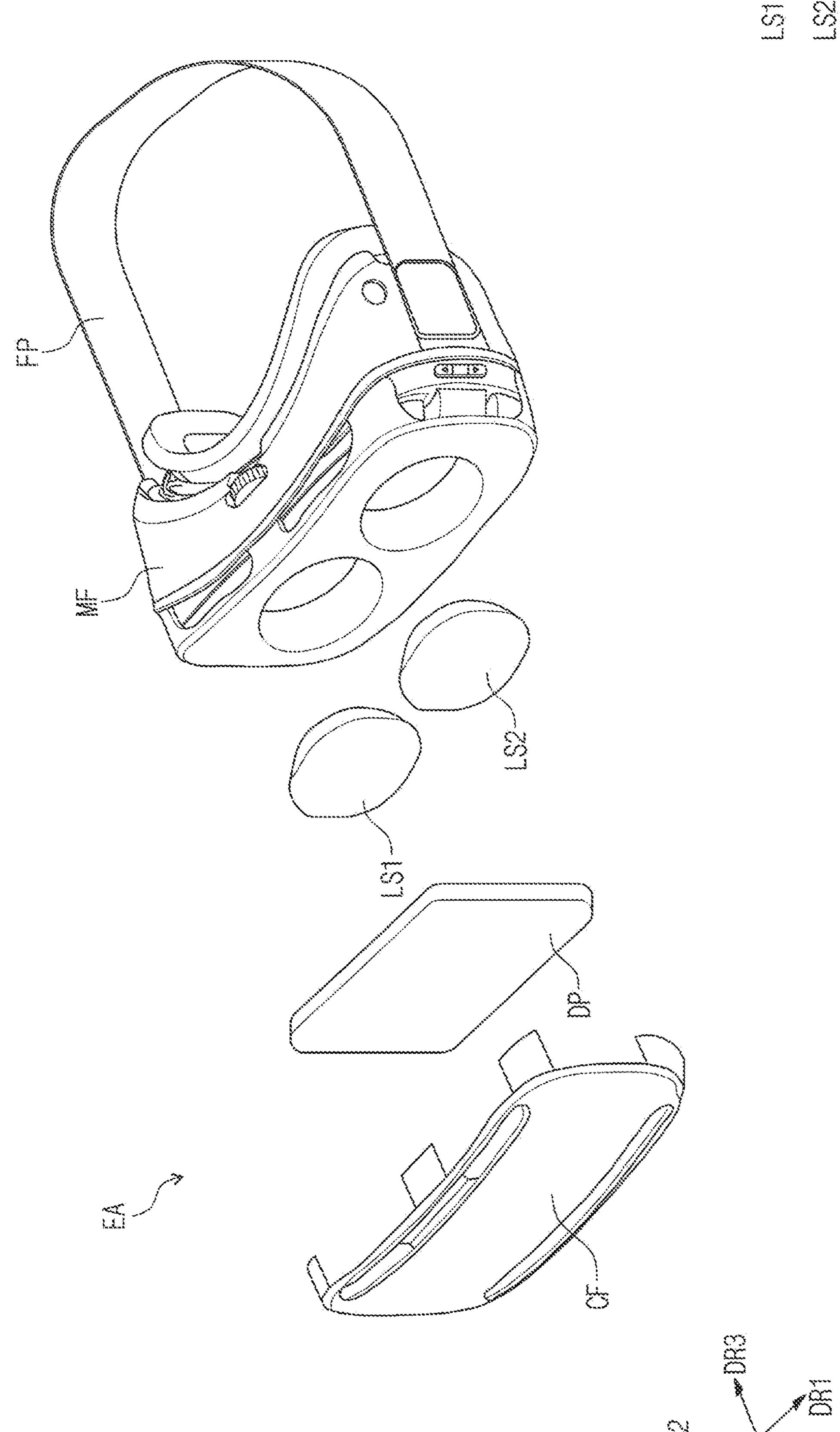
FIG. 1 is an exploded perspective view showing an electronic apparatus of one or more embodiments of the present disclosure.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present disclosure, when an element (or a region, a layer, a portion, etc.) is referred to as being "on," "connected to," or "coupled to" another element, it may refer to that the element may be directly disposed on/connected to/coupled to the other element, or that a third element may be disposed therebetween.

Like reference numerals refer to like elements. Also, in the drawings, the thickness, the ratio, and the dimensions of elements may be exaggerated for an effective description of technical contents. The term "and/or" or "or" may include any and all combinations of one or more of which associated elements may define. Expressions such as "at least one of," "one of," and "selected from," when preceding a list of elements, modify the entire list of elements and do not modify the individual elements of the list. For example, "at least one of a, b, or c", "at least one selected from a, b, and c", "at least one selected from among a to c", etc., may indicate only a, only b, only c, both (e.g., simultaneously) a and b, both (e.g., simultaneously) a and c, both (e.g., simultaneously) b and c, all of a, b, and c, or variations thereof. The "/" utilized herein may be interpreted as "and" or as "or" depending on the situation.

It will be understood that, although the terms "first," "second," etc. may be utilized herein to describe one or more suitable elements, these elements should not be limited by these terms. These terms are only utilized to distinguish one element from another. For example, a first element may be referred to as a second element, and a second element may also be referred to as a first element in a similar manner without departing the scope of the present disclosure. The terms of a singular form may include plural forms unless the context clearly indicates otherwise.

In some embodiments, terms such as "below," "lower," "above," "upper," and/or the like are utilized to describe the relationship of the elements shown in the drawings. The terms are utilized as a relative concept and are described with reference to the direction indicated in the drawings.

It should be understood that the term "comprise(s)," "include(s)," or "have/has" is intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) utilized herein have the same meaning as commonly understood by one of ordinary skill in the art to which the present disclosure pertains. It is also to be understood that terms such as terms defined in commonly utilized dictionaries should be interpreted as having meanings consistent with the meanings in the context of the related art, and should not be interpreted in too ideal a sense or an overly formal sense unless explicitly defined herein.

Hereinafter, a display panel of one or more embodiments of the present disclosure and an electronic apparatus including the display panel will be described in more detail with reference to the accompanying drawings.

FIG. 1 is an exploded perspective view showing an electronic apparatus EA according to one or more embodiments of the present disclosure. The electronic apparatus EA may be a device activated by an electrical signal. For example, the electronic apparatus EA may be a television, a monitor, an external billboard, a game console, a personal computer, a laptop computer, a cell phone, a tablet, a car navigation system unit, or a wearable device, but embodiments of the present disclosure are not limited thereto.

In FIG. 1, as an example of the electronic apparatus EA, a head mounted display (HMD) device is illustrated. The head mounted display device may be a device mounted on a user's head to provide a screen on which a picture and/or an image is displayed to a user. The head mounted display device may include a see-through type or kind that provides augmented reality (AR) based on actual external objects and/or a see-closed type or kind that provides virtual reality (VR) to a user as a screen independent of an external object.

Referring to FIG. 1, the electronic apparatus EA may include a display panel DP and a lens unit LS facing the display panel. In some embodiments, the electronic apparatus EA may further include a main frame MF, a cover frame CF, and a fixing part FP.

The main frame MF may be a part worn on (e.g., accommodating to) a user's face. The main frame MF may have a shape corresponding to the shape of the user's head (face). For example, the length of the fixing part FP may be adjusted according to the circumference of the user's head. The fixing part FP is a structure that facilitates mounting of the main frame MF, and may include a strap, a band, and/or the like. However, embodiments of the present disclosure are not limited thereto, and the fixing part FP may be in one or more suitable forms such as a helmet or a leg of glasses, which is coupled to the main frame MF.

On the main frame MF, the lens unit LS, the display panel DP, and the cover frame CF may be mounted. The main frame MF may include a space or structure in which the lens unit LS and the display panel DP may be accommodated.

The lens unit LS may be disposed between the display panel DP and a user. The lens unit LS may be to transmit light emitted from the display panel DP to provide the light to the user. For example, the lens unit LS may include one or more suitable types (kinds) of lenses such as a multi-channel lens, a convex lens, a concave lens, a spherical lens, an aspherical lens, a single lens, a composite lens, a standard lens, a narrow-angle lens, a wide-angle lens, a fixed-focus lens, a varifocal lens, and/or the like.

The lens unit LS may include a first lens LS1 and a second lens LS2. The first lens LS1 and the second lens LS2 may be disposed to correspond to the positions of the user's right and left eyes, respectively. The first lens LS1 and the second lens LS2 may be accommodated inside the main frame MF.

The display panel DP may be provided in a state of being fixed to the main frame MF, or may be provided in a detachable state. The display panel DP of one or more embodiments may include an optical auxiliary layer OAL (see FIG. 4A), and thus may exhibit excellent or suitable display efficiency and display lifespan. The display panel DP will be described in more detail later.

The cover frame CF may be disposed on one surface of the display panel DP to protect the display panel DP. The cover frame CF and the lens unit LS may be spaced apart from each other with the display panel DP interposed therebetween.

In FIG. 1 and the following drawings, a first direction axis DR1 to a third direction axis DR3 are illustrated, and directions indicated by the first to the third direction axes DR1, DR2, and DR3 described in the present disclosure are relative concepts, and may be converted to different directions. In some embodiments, the directions indicated by the first to the third direction axes DR1, DR2, and DR3 may be described as first to third directions, and may be denoted by the same reference numerals. In the present disclosure, the first direction axis DR1 and the second direction axis DR2 are perpendicular to each other, and the third direction axis DR3 may be a normal direction with respect to a plane defined by the first direction axis DR1 and the second direction axis DR2.

A thickness direction of the electronic apparatus EA may be a direction parallel to the third direction axis DR3, which is the normal direction with respect to the plane defined by the first direction axis DR1 and the second direction axis DR2. In the present disclosure, a front surface (or an upper surface) and a rear surface (or a lower surface) of members constituting the electronic apparatus EA may be defined on the basis of the third direction axis DR3. In the present disclosure, "on a plane" ("in a plan view") may refer to (viewing) a plane parallel to the plane defined by the first direction axis DR1 and the second direction axis DR2, and "on a cross-section" ("in a cross-sectional view") may refer to (viewing) a plane parallel to the third direction axis DR3.

Figure 2A:
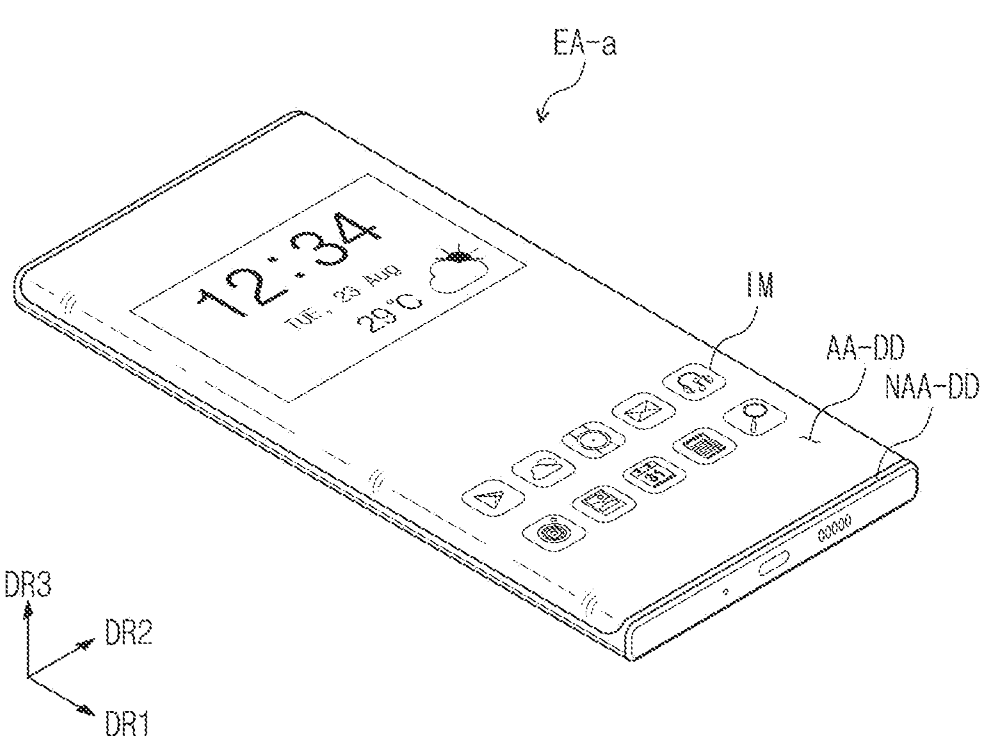
FIG. 2A is a perspective view showing an electronic apparatus of one or more embodiments of the present disclosure.

FIG. 2A is a perspective view showing an electronic apparatus EA-a of one or more embodiments of the present disclosure and illustrates a cell phone as an example of the electronic apparatus EA-a. The electronic device EA-a may display an image IM through an active region AA-DD. The active region AA-DD may include a plane defined by a first direction axis DR1 and a second direction axis DR2. The active region AA-DD may include a curved surface bent from at least one side of the plane defined by the first direction axis DR1 and the second direction axis DR2. However, this is merely an example, and the shape of the active region AA-DD is not limited thereto. For example, in some embodiments, the active region AA-DD may include only the plane. In some embodiments, the active region AA-DD may further include four curved surfaces bent from at least two, for example, four side surfaces of the plane, respectively.

A peripheral region NAA-DD is adjacent to the active region AA-DD. The peripheral region NAA-DD may surround (or be around) the active region AA-DD. Accordingly, the shape of the active region AA-DD may substantially be defined by the peripheral region NAA-DD. However, this is only illustrated as an example, and the peripheral region NAA-DD may be disposed adjacent to only one side of the active region AA-DD, or may not be provided. The active region AA-DD may be provided in one or more suitable shapes, and embodiments of the present disclosure are not limited thereto.

Figure 2B:
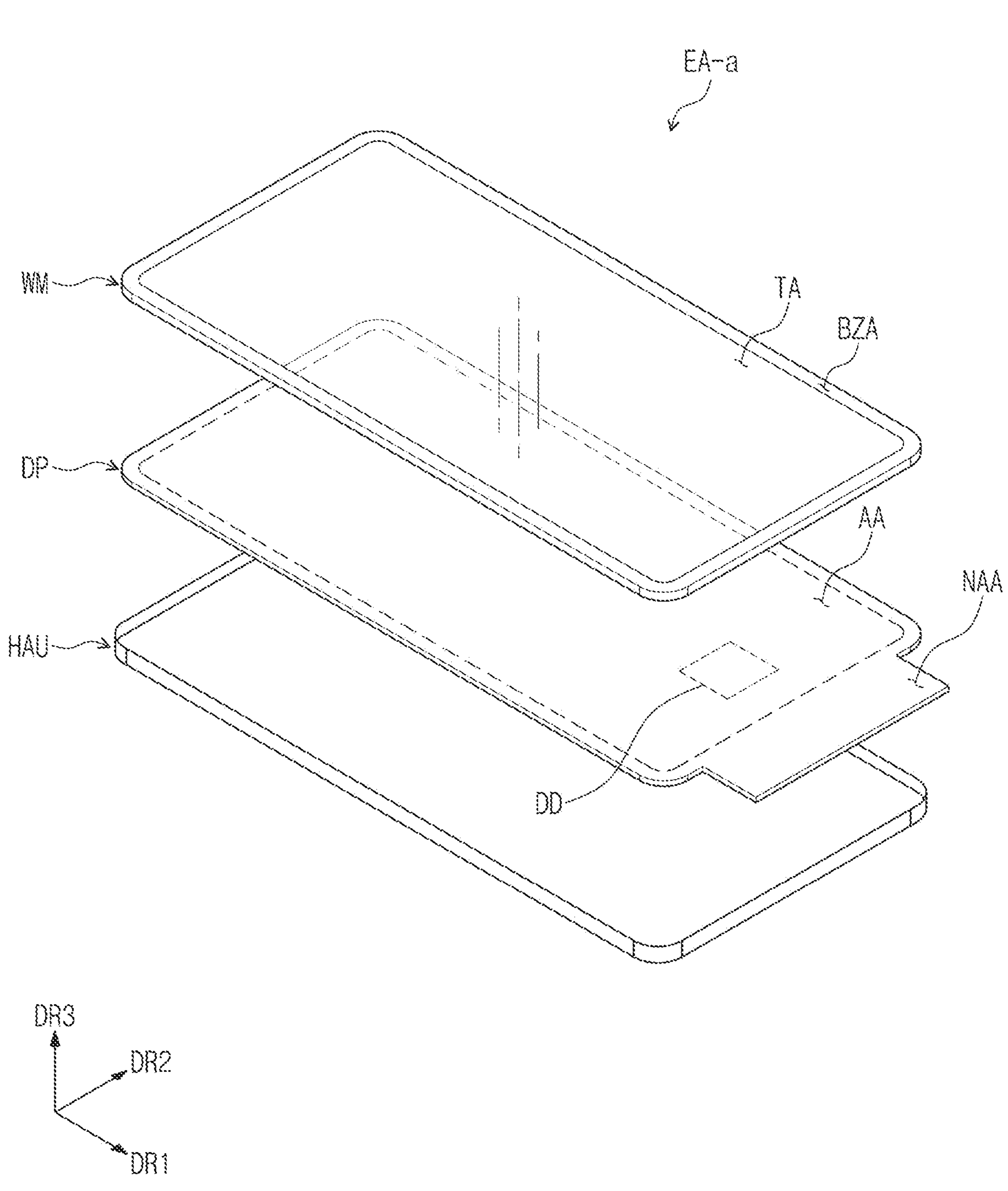
FIG. 2B is an exploded perspective view of the electronic apparatus illustrated in FIG. 2A.

FIG. 2B is an exploded perspective view of the electronic apparatus EA-a illustrated in FIG. 2A. Referring to FIG. 2B, the electronic apparatus EA-a may include a housing HAU, a display panel DP, and a window member WM.

The window member WM may cover the entire outer side of the display panel DP. The window member WM may include a transmission region TA and a bezel region BZA. A front surface of the window member WM including the transmission region TA and the bezel region BZA may correspond to a front surface of the electronic apparatus EA-a. The transmission region TA may correspond to the active region AA-DD of the electronic apparatus EA-a illustrated in FIG. 2A, and the bezel region BZA may correspond to the peripheral region NAA-DD of the electronic apparatus EA-a illustrated in FIG. 2A.

The transmission region TA may be an optically transparent region. The bezel region BZA may be a region having relatively low light transmittance compared to the transmission region TA. The bezel region BZA may have a set or predetermined color. The bezel region BZA may be adjacent to the transmission region TA and may surround (or be around) the transmission region TA. The bezel region BZA may define the shape of the transmission region TA. However, embodiments of the present disclosure are not limited to what is illustrated. In some embodiments, the bezel region BZA may be disposed adjacent to only one side of the transmission region TA, or a portion of the bezel region BZA may not be provided.

The display panel DP of one or more embodiments may include an optical auxiliary layer OAL (see FIG. 4A), and thus may exhibit excellent or suitable display efficiency and display lifespan. The display panel DP will be described in more detail later.

In some embodiments, on the display panel DP, an input sensor may be provided. The input sensor may sense an external input applied from the outside. The external input may be a user input. The user input may include one or more suitable forms of external inputs, such as a part of a user's body, light, heat, a pen, a pressure, and/or the like. In some embodiments, the input sensor may be disposed on an encapsulation layer TFE (see FIG. 4A) of the display panel DP to be described later. In some embodiments, the input sensor may be directly disposed on the encapsulation layer TFE (see FIG. 4A), or may be directly disposed on an adhesive member disposed on the encapsulation layer TFE (see FIG. 4A). The adhesive member may include an adhesive or pressure-sensitive adhesive.

In the present disclosure, when an element (or a region, a layer, a portion, etc.) is referred to as being "directly disposed" on another element, it may refer to that one or more third elements are not disposed between the element and the another (the other) element. For example, when an element is "directly disposed" on another element, it may refer to that the element and the another element are in "contact" with each other.

The housing HAU may accommodate the display panel DP and/or the like. The housing HAU may be coupled to the window member WM.

Figure 3:
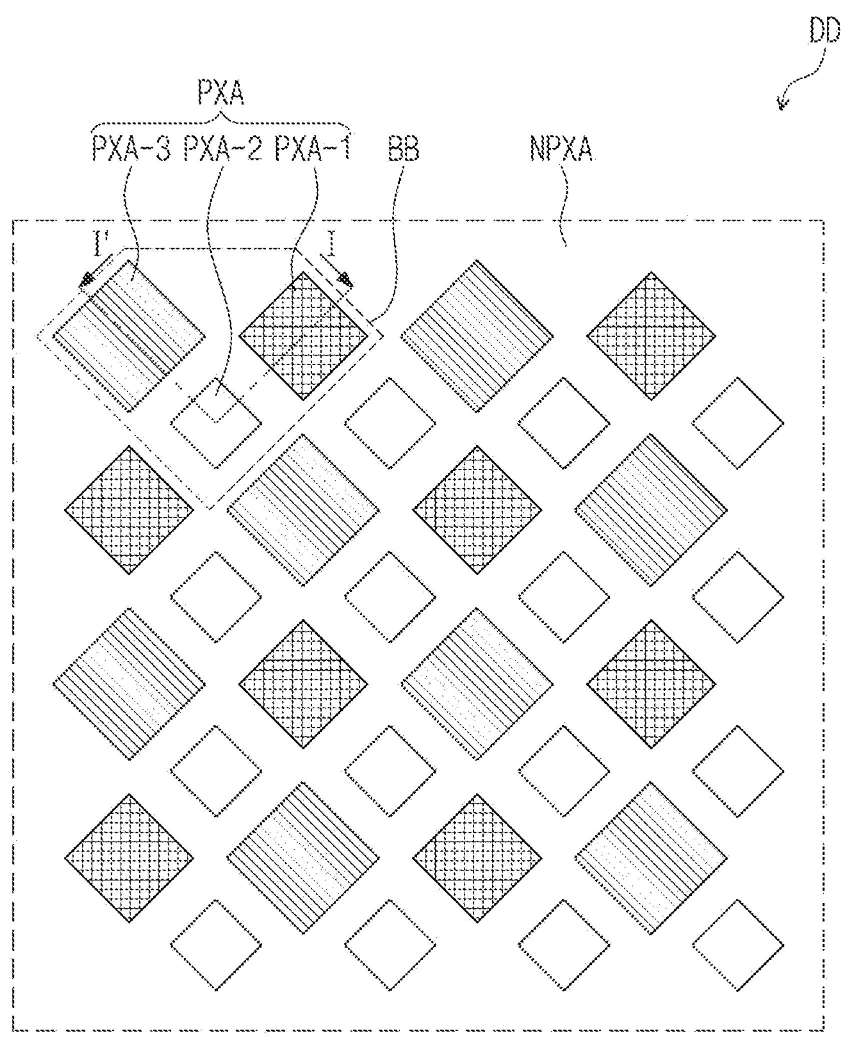
FIG. 3 is a plan view showing a display panel according to one or more embodiments of the present disclosure.
Figure 3:
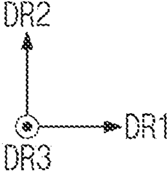

FIG. 3 is a plan view showing the display panel DD according to an embodiment of the present disclosure. Hereinafter, the description of the display panel DD may be equally applied to the display panel DP included in the electronic apparatuses ED and ED-a respectively illustrated in FIG. 1 and FIG. 2B.

Referring to FIG. 3, the display panel DD may include a light emitting region PXA and a non-light emitting region NPXA. The non-light emitting region NPXA may surround the light emitting region PXA. The light emitting region PXA may be provided in plurality. The light emitting region PXA may include a first light emitting region PXA-1, a second light emitting region PXA-2, and a third light emitting region PXA-3. The first light emitting region PXA-1, the second light emitting region PXA-2, and the third light emitting region PXA-3 may each emit light of a different wavelength region. In one or more embodiments, the first light emitting region PXA-1 may be to emit first light, and the second light emitting region PXA-2 may be to emit second light different from the first light. The third light emitting region PXA-3 may be to emit third light different from the first light and the second light.

Among the first to the third light emitting regions PXA-1, PXA-2, and PXA-3, in some embodiments, an area of the third light emitting region PXA-3 may be the largest, and an area of the second light emitting region PXA-2 may be the smallest. However, this is a mere example, and the areas of the first to the third light emitting regions PXA-1, PXA-2, and PXA-3 are not limited thereto. FIG. 3 illustrates that, in one or more embodiments, the first light emitting region PXA-1 and the third light emitting region PXA-3 may be alternately arranged in one row, and that the second light emitting region PXA-2 may be arranged in another row while being spaced apart from the first light emitting region PXA-1 and the third light emitting region PXA-3. However, this is a mere example, and the arrangement of the first to the third light emitting regions PXA-1, PXA-2, and PXA-3 is not limited thereto.

Figure 4A:
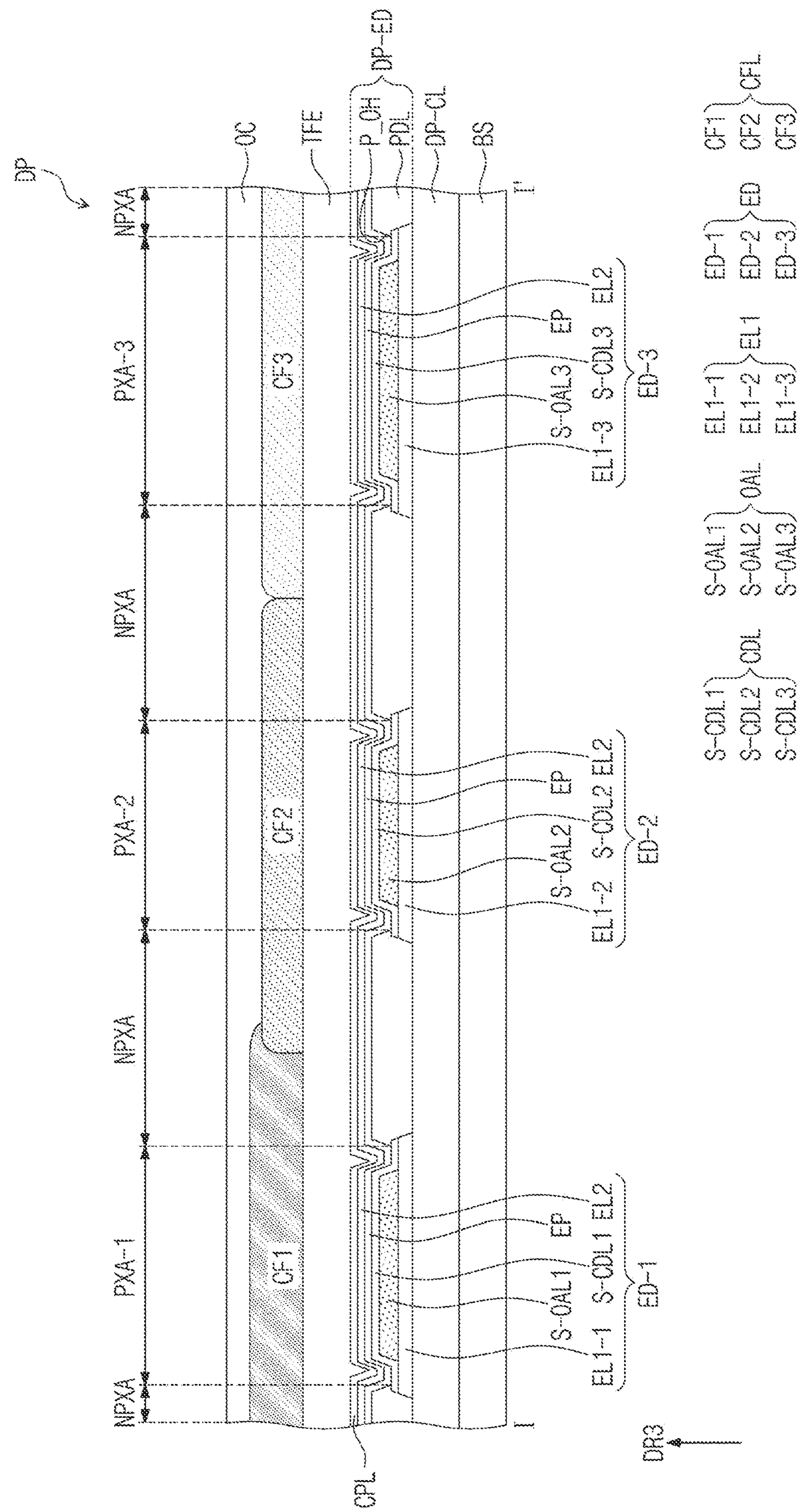
FIG. 4A is a cross-sectional view showing a portion of a display panel of one or more embodiments of the present disclosure.
Figure 4B:
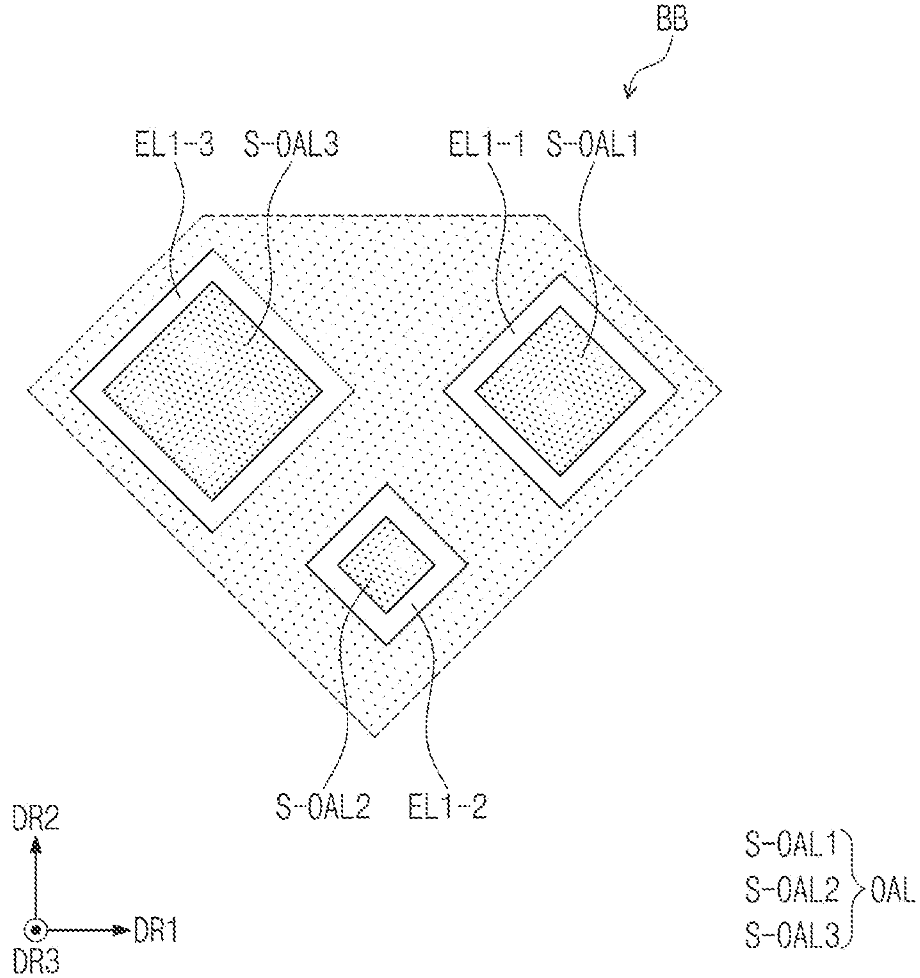
FIG. 4B is a plan view showing a portion of a display panel of one or more embodiments of the present disclosure.
Figure 5A:
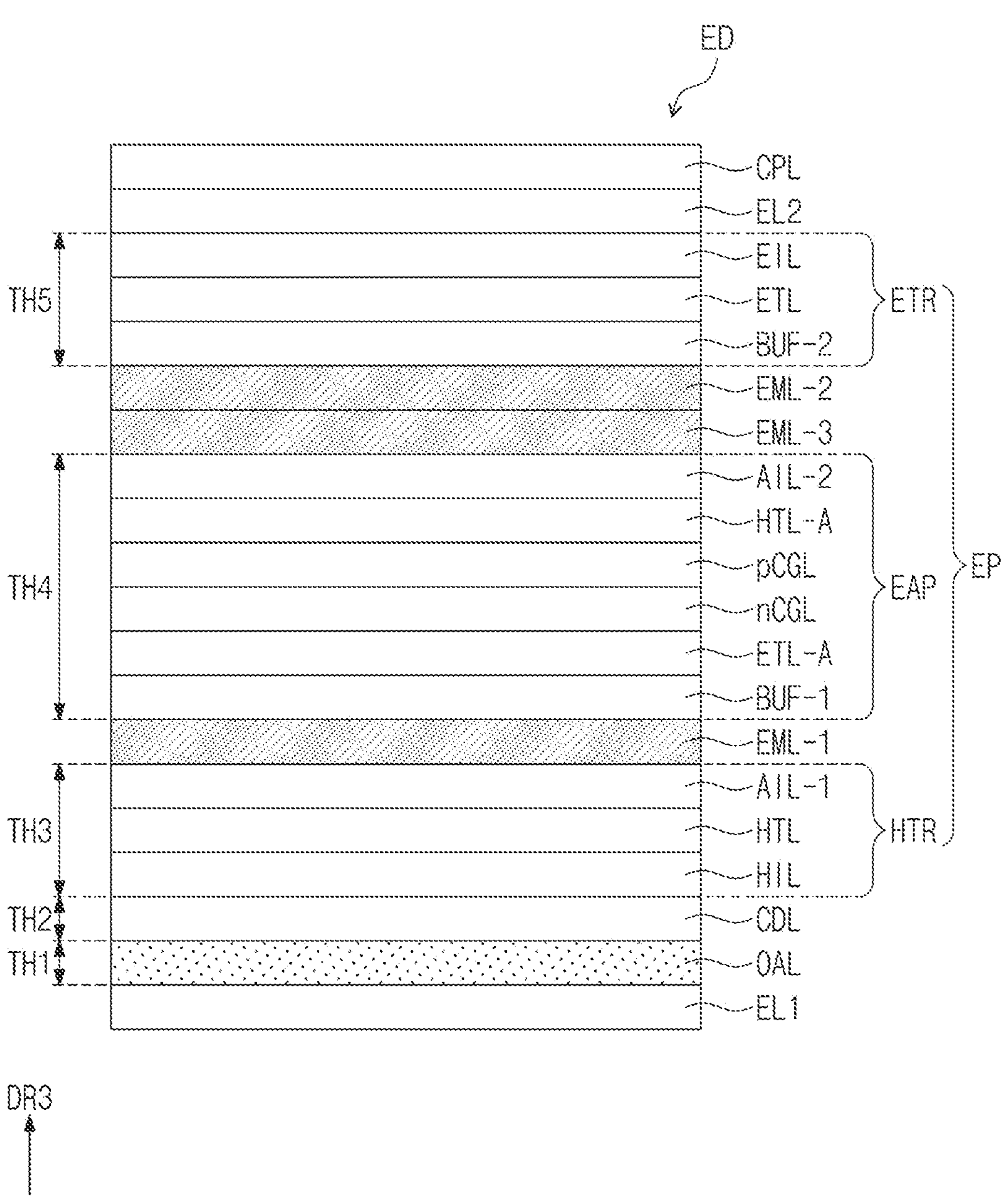
FIG. 5A is a cross-sectional view showing a light emitting element of one or more embodiments of the present disclosure.
Figure 5B:
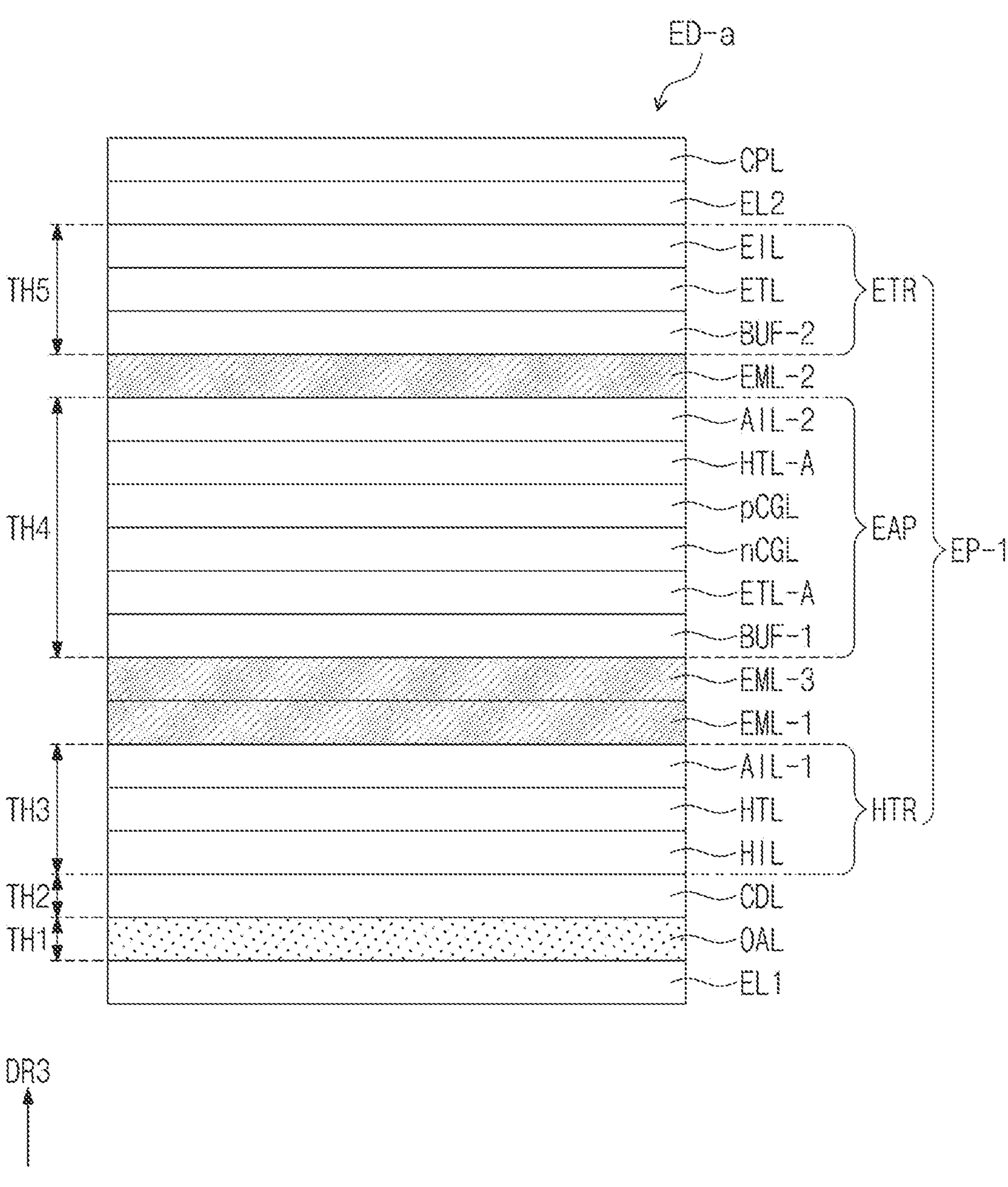
FIG. 5B is a cross-sectional view showing a light emitting element of one or more embodiments of the present disclosure.
Figure 5C:
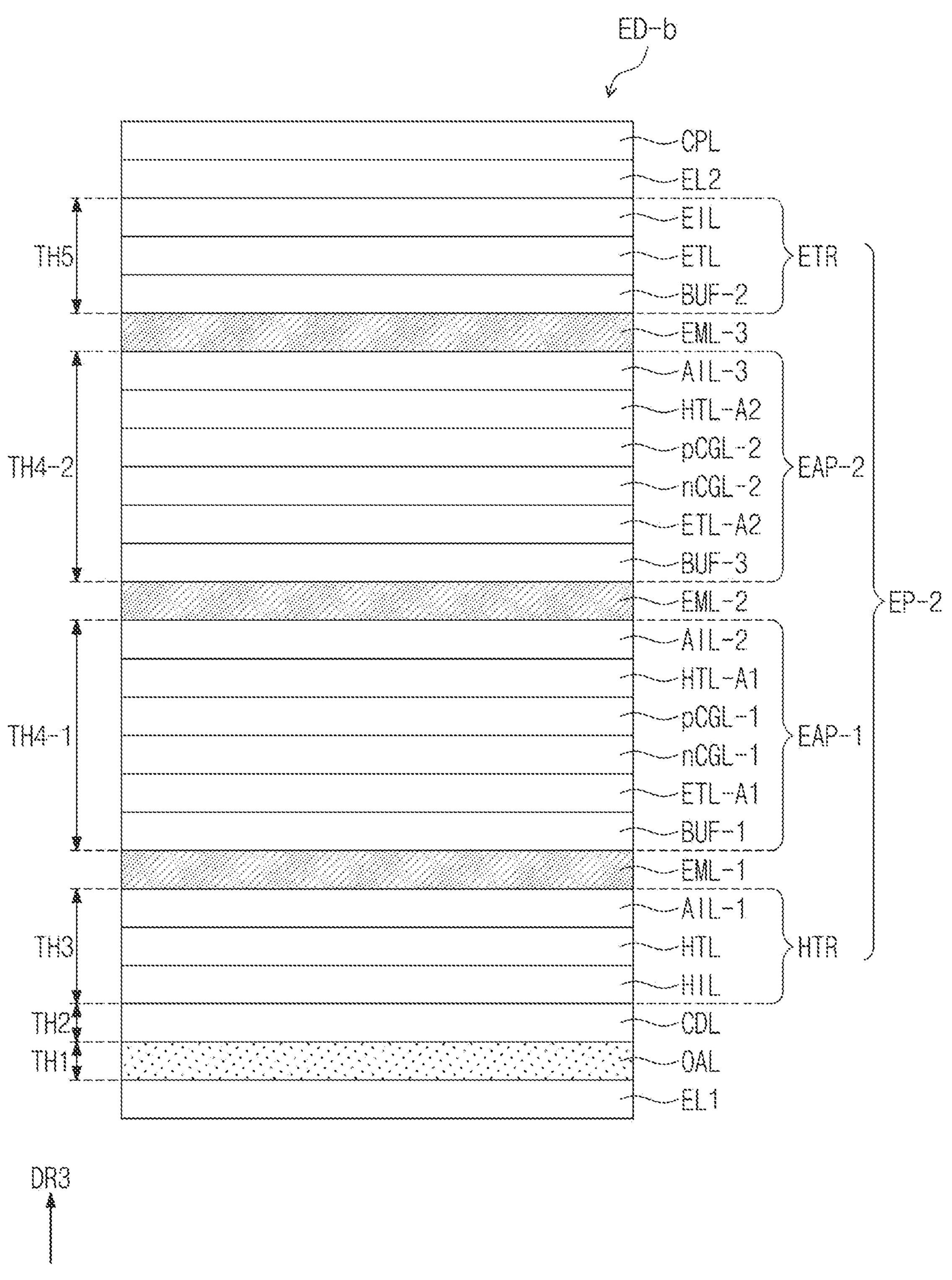
FIG. 5C is a cross-sectional view showing a light emitting element of one or more embodiments of the present disclosure.

FIG. 4A is a cross-sectional view of a display panel DP of one or more embodiments of the present disclosure. FIG. 4A is a cross-sectional view showing a portion corresponding to line I-I' of FIG. 3, and may be a cross-sectional view of the display device DP according to one or more embodiments. FIG. 4B is a plan view showing a portion of a display panel DP of one or more embodiments of the present disclosure. FIG. 4B is a view showing a portion corresponding to BB of FIG. 3. For convenience of description, In FIG. 4B, only the first electrodes EL1-1, EL1-2, and EL1-3 and the optical auxiliary layer OAL are illustrated. FIG. 5A is a cross-sectional view of a light emitting element of one or more embodiments of the present disclosure. FIG. 5B is a cross-sectional view of a light emitting element of one or more embodiments of the present disclosure. FIG. 5C is a cross-sectional view of a light emitting element of one or more embodiments of the present disclosure. The description of the light emitting element described with reference to FIG. 5A to FIG. 5C may be equally applied to each of first to third light emitting elements of FIG. 4A.

Referring to FIG. 4A, the display panel DP may include a base layer BS, a circuit layer DP-CL on the base layer BS, a display element layer DP-ED on the circuit layer DP-CL, and an encapsulation layer TFE on the display element layer DP-ED. In some embodiments, the display panel DP may further include a color filter layer CFL on the encapsulation layer TFE. In some embodiments, the display panel DP may further include an organic layer OC on the color filter layer CFL. The organic later may include at least one of an acrylic-based resin, a silicone-based resin, or an epoxy-based resin.

The base layer BS may be a member which provides a base surface on which the circuit layer DP-CL is disposed. The base layer BS may be a rigid substrate or a flexible substrate capable of bending, folding, rolling, and/or the like. The base layer BS may be a glass substrate, a metal substrate, a polymer substrate, and/or the like. However, embodiments of the present disclosure are not limited thereto, in some embodiments, the base layer BS may be an inorganic layer, an organic layer, or a composite material layer.

The base layer BS may include a single-layered or multi-layered structure. For example, in one or more embodiments, the base layer BS may include a first synthetic resin layer, a middle layer of a multi-layered or single-layered structure, and a second synthetic resin layer, which are sequentially stacked in the stated order. The middle layer may be referred to as a base barrier layer. The middle layer may include a silicon oxide (SiOx) layer and an amorphous silicon (a-Si) layer disposed on the silicon oxide layer, but embodiments of the present disclosure are not particularly limited thereto. For example, in some embodiments, the middle layer may include at least one of a silicon oxide layer, a silicon nitride layer, a silicon oxynitride layer, or an amorphous silicon (a-Si) layer.

Each of the first and second synthetic resin layers may include a polyimide-based resin. In some embodiments, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the present disclosure, a "~~"-based resin refers to that a functional group of "~~" is included in the resin.

The circuit layer DP-CL may be on the base layer BS. The circuit layer DP-CL may include an insulation layer, a semiconductor pattern, a conductive pattern, a signal line, and/or the like. After (e.g., on) the insulation layer, a semiconductor layer and a conductive layer are formed on (above) the base layer BS by coating, deposition, and/or the like, the insulation layer, the semiconductor layer, and the conductive layer may be selectively patterned by performing a photolithography process a plurality of times. Thereafter, the semiconductor pattern, the conductive pattern, and the signal line included in the circuit layer DP-CL may be formed.

The display element layer DP-ED may be on the circuit layer DP-CL. The display element layer DP-ED may include first to third light emitting elements ED-1, ED-2, and ED-3, and a pixel definition film PDL. Referring to FIG. 4A, the first to the third light emitting elements ED-1, ED-2, and ED-3 may be spaced apart in one direction perpendicular to the thickness direction axis DR3. The first to the third light emitting elements ED-1, ED-2, and ED-3 may be distinguished by the pixel definition film PDL.

The pixel definition film PDL may include a silicon-based inorganic substance. For example, in one or more embodiments, the pixel definition film PDL may include at least one of silicon nitride, silicon oxynitride, or silicon oxide. The display panel DP of one or more embodiments may include the pixel definition film PDL, so that color mixing due to side leakage between adjacent light emitting elements ED-1, ED-2, and ED-3 may be prevented or reduced.

The first to the third light emitting elements ED-1, ED-2, and ED-3 may be light emitting elements of a tandem structure. The first to the third light emitting elements ED-1, ED-2, and ED-3 may each include the respective first electrode EL1-1, EL1-2, or EL1-3, a light emitting unit EP on the first electrodes EL1-1, EL1-2, and EL1-3, and a second electrode EL2 on the light emitting unit EP. In some embodiments, each of the first to the third light emitting elements ED-1, ED-2, and ED-3 may further include a capping layer CPL. The light emitting unit EP may include a plurality of light emitting layers EML-1, EML-2, and EML-3. The light emitting unit EP will be described in more detail later. Each of the first to the third light emitting elements ED-1, ED-2, and ED-3 may be to emit white light (e.g., combined white light).

In one or more embodiments, in the first to the third light emitting elements ED-1, ED-2, ED-3, the light emitting unit EP may be provided as a common layer. The light emitting unit EP may overlap the first to the third light emitting regions PXA-1, PXA-2, and PXA-3 and the non-light emitting region NPXA. In some embodiments, in the first to the third light emitting elements ED-1, ED-2, and ED-3, the second electrode EL2 may be provided as a common electrode. In the present disclosure, the overlap of one element and another element is not limited to the same area and the same shape on a plane, and may also include having a different area and/or a different shape.

Referring to FIG. 4A, each of the first to the third light emitting elements ED-1, ED-2, and ED-3 may include an optical auxiliary layer OAL and a conductive layer CDL between the first electrode EL1 and the light emitting unit EP, for example, between the respective first electrode EL1-1, EL1-2, or EL1-3 and the light emitting unit EP. The optical auxiliary layer OAL may be directly on the first electrode EL1. The optical auxiliary layer OAL may include first to third sub-optical auxiliary layers S-OAL1, S-OAL2, and S-OAL3. The first sub-optical auxiliary layer S-OAL1 may be an optical auxiliary layer included in the first light emitting element ED-1, the second sub-optical auxiliary layer S-OAL2 may be an optical auxiliary layer included in the second light emitting element ED-2, and the third sub-optical auxiliary layer S-OAL3 may be an optical auxiliary layer included in the third light emitting element ED-3.

The conductive layer CDL may be directly on the optical auxiliary layer OAL and may cover the optical auxiliary layer OAL. The conductive layer CDL may include first to third sub-conductive layers S-CDL1, S-CDL2, and S-CDL3. The first sub-conductive layer S-CDL1 may be a conductive layer included in the first light emitting element ED-1, the second sub-conductive layer S-CDL2 may be a conductive layer included in the second light emitting element ED-2, and the third sub-conductive layer S-CDL3 may be a conductive layer included in the third light-emitting element ED-3.

A pixel opening P_OH of the pixel definition film PDL may expose at least a portion of the first electrodes EL1-1, EL1-2, and EL1-3. The first to the third light emitting regions PXA-1, PXA-2, and PXA-3 may be defined to correspond to the first electrodes EL1-1, EL1-2, and EL1-3 exposed by the pixel opening P_OH. The non-light emitting region NPXA may be a region corresponding to the pixel definition film PDL.

The pixel definition film PDL may be spaced (e.g., spaced apart) from the optical auxiliary layer OAL with the conductive layer CDL interposed therebetween. The pixel definition film PDL may be disposed on the first electrode EL1-1 of the first light emitting element ED-1 and the first electrode EL1-2 of the second light emitting element ED-2.

The encapsulant layer TFE may be on the display element layer DP-ED. The encapsulation layer TFE may protect the display element layer DP-ED from foreign materials such as moisture, oxygen, and/or dust particles. The encapsulation layer TFE may include at least one inorganic film (hereinafter, an encapsulation inorganic film). In some embodiments, the encapsulation layer TFE may include at least one organic film (hereinafter, an encapsulation organic film) and at least one encapsulation inorganic film.

The encapsulation inorganic film may protect the display element layer DP-ED from moisture/oxygen, and the encapsulation organic film may protect the display element layer DP-ED from foreign materials such as dust particles. The encapsulation inorganic film may include silicon nitride, silicon oxy nitride, silicon oxide, titanium oxide, aluminum oxide, and/or the like, but embodiments of the present disclosure are not particularly limited thereto. The encapsulation organic film may include an acrylic compound, an epoxy-based compound, and/or the like. In some embodiments, the encapsulation organic film may include a photopolymerizable organic material, but embodiments of the present disclosure are not particularly limited thereto.

On the encapsulation layer TFE, the color filter layer CFL may be disposed and provided. The color filter layer CFL may include a first filter CF1 corresponding to the first light emitting region PXA-1, a second filter CF2 corresponding to the second light emitting region PXA-2, and a third filter CF3 corresponding to the third light emitting region PXA-3. In one or more embodiments, the color filter layer CFL may further include a light blocking member. The light blocking member may be a black matrix. The light blocking member may be formed by including an organic light blocking material or inorganic light blocking material containing a black pigment and/or a black dye. The light blocking member may prevent or reduce a light leakage phenomenon and may distinguish boundaries between adjacent filters CF1, CF2, and CF3.

Each of the first to the third filters CF1, CF2, and CF3 may include a polymer photosensitive resin and a colorant. In the present disclosure, the colorant may include a pigment and/or a dye. A red colorant may include a red pigment and/or a red dye, a green colorant may include a green pigment and/or a green dye, and a blue colorant may include a blue pigment and/or a blue dye.

In FIG. 4A, in one or more embodiments, the first filter CF1 may include a red pigment and/or a red dye, the second filter CF2 may include a green pigment and/or a green dye, and the third filter CF3 may include a blue pigment and/or a blue dye. The first filter CF1 may be to transmit red light. The second filter CF2 may be to transmit green light. The third filter CF3 may be to transmit blue light.

In one or more embodiments, the first filter CF1 disposed on the first light emitting element ED-1 may include a red colorant. The second filter CF2 disposed on the second light emitting element ED-2 may include a green colorant. The third filter CF3 disposed on the third light emitting element ED-3 may include a blue colorant. This is only an example, and embodiments of the present disclosure are not limited thereto. In some embodiments, the first filter CF1 disposed on the first light emitting element ED-1 may include a green colorant, the second filter CF2 disposed on the second light emitting element ED-2 may include a red colorant, and the third filter CF3 disposed on the third light emitting element ED-3 may include a blue colorant.

Referring to FIG. 4A and FIG. 4B, when viewed on a plane (e.g., a plan view). the first to the third sub-optical auxiliary layers S-OAL1, S-OAL2, and S-OAL3 may be respectively disposed on the first electrodes EL1-1, EL1-2, and EL1-3. When viewed on a plane (e.g., in a plan view), an area of the first sub-optical auxiliary layer S-OAL1 may be smaller than that of the first electrode EL1-1 of the first light emitting element ED-1. When viewed on a plane (e.g., in a plan view), an area of the second sub-optical auxiliary layer S-OAL2 may be smaller than that of the first electrode EL1-2 of the second light emitting element ED-2. When viewed on a plane (e.g., in a plan view), an area of the third sub-optical auxiliary layer S-OAL3 may be smaller than that of the first electrode EL1-3 of the third light emitting element ED-3.

The first sub-optical auxiliary layer S-OAL1 may cover a portion of the first electrode EL1-1 of the first light emitting element ED-1. The first sub-optical auxiliary layer S-OAL1 may expose a portion of the first electrode EL1-1 of the first light emitting element ED-1. The first electrode EL1-1 of the first light emitting element ED-1 exposed from the first sub-optical auxiliary layer S-OAL1 may be in contact with the first sub-conductive layer S-CDL1.

The second sub-optical auxiliary layer S-OAL2 may cover a portion of the first electrode EL1-2 of the second light emitting element ED-2. The second sub-optical auxiliary layer S-OAL2 may expose a portion of the first electrode EL1-2 of the second light emitting element ED-2. The first electrode EL1-2 of the second light emitting element ED-2 exposed from the second sub-optical auxiliary layer S-OAL2 may be in contact with the second sub-conductive layer S-CDL2.

The third sub-optical auxiliary layer S-OAL3 may cover a portion of the first electrode EL1-3 of the third light emitting element ED-3. The third sub-optical auxiliary layer S-OAL3 may expose a portion of the first electrode EL1-3 of the third light emitting element ED-3. The first electrode EL1-3 of the third light emitting element ED-3 exposed from the third sub-optical auxiliary layer S-OAL3 may be in contact with the third sub-conductive layer S-CDL3.

In one or more embodiments, thicknesses of the first to the third sub-optical auxiliary layers S-OAL1, S-OAL2, and S-OAL3 may be all the same (e.g., substantially the same). For example, the first to the third light emitting elements ED-1, ED-2, and ED-3 may include optical auxiliary layers having the same thickness (e.g., substantially the same thickness). Accordingly, resonance distances of the first to the third lights respectively emitted from the first to the third light emitting layers EML-1, EML-2, and EML-3 (see FIG. 5A) included in the first to the third light emitting elements ED-1, ED-2, and ED-3 may be respectively the same (e.g., substantially the same) in each of the first to the third light emitting elements ED-1, ED-2, and ED-3.

Referring to FIG. 4A and FIG. 5A, the light emitting unit EP according to one or more embodiments may include a hole transport region HTR, a first light emitting layer EML-1, a light emitting auxiliary unit EAP, a second light emitting layer EML-2, a third light emitting layer EML-3, and an electron transport region ETR.

The sum of a thickness TH2 of the conductive layer CDL, a thickness TH3 of the hole transport region HTR, a thickness TH4 of the light emitting auxiliary unit EAP, and a thickness TH5 of the electron transport region ETR may be about 50 nm to about 250 nm. When the sum of the thickness TH2 of the conductive layer CDL, the thickness TH3 of the hole transport region HTR, the thickness TH4 of the light emitting auxiliary unit EAP, and the thickness TH5 of the electron transport region ETR is about 50 nm to about 250 nm, an increase in drive voltage may be minimized or reduced and the generation of light in the first to the third light emitting layers EML-1, EML-2 and EML-3 may be facilitated. When the sum of the thickness TH2 of the conductive layer CDL, the thickness TH3 of the hole transport region HTR, the thickness TH4 of the light emitting auxiliary unit EAP, and the thickness TH5 of the electron transport region ETR is greater than about 250 nm, an increase in the thickness of a display panel and an increase in the driving voltage thereof may be caused. When the sum of the thickness TH2 of the conductive layer CDL, the thickness TH3 of the hole transport region HTR, the thickness TH4 of the light emitting auxiliary unit EAP, and the thickness TH5 of the electron transport region ETR is less than about 50 nm, first to third light emitting layers may not be composed of layers containing materials necessary for generating light.

In the first to the third light emitting elements ED-1, ED-2, and ED-3, the hole transport region HTR, the first light emitting layer EML-1, the light emitting auxiliary unit EAP, the second light emitting layer EML-2, the third light emitting layer EML-3, and the electron transport region ETR may each be provided as a common layer. The light emitting element ED including the first light emitting layer EML-1, the second light emitting layer EML-2, and the third light emitting layer EML-3, which generate light of different wavelength regions, may be to emit white light (e.g., combined white light).

Because the first to the third light emitting layers EML-1, EML-2, and EML-3 each provided as a common layer may be deposited without a mask, so that a pixel having a small area may be formed. The display panel DP according to one or more embodiments may exhibit high resolution by including a large number of pixels having a small area on a plane.

The first electrode EL1-1, EL1-2, and/or EL1-3 may be formed (e.g., composed) of a metal material, a metal alloy, and/or a conductive compound. The first electrode EL1-1, EL1-2, and/or EL1-3 may be an anode or a cathode. However, embodiments of the present disclosure are not limited thereto. In one or more embodiments, the first electrode EL1-1, EL1-2, and/or EL1-3 may be a pixel electrode. The first electrode EL1-1, EL1-2, and/or EL1-3 may be a transmissive electrode, a transflective electrode, or a reflective electrode. The first electrode EL1-1, EL1-2, and/or EL1-3 may include at least one selected from silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), lithium fluoride (LiF), molybdenum (Mo), titanium (Ti), tungsten (W), indium (In), tin (Sn), zinc (Zn), a compound of two or more selected therefrom, a mixture of two or more selected therefrom, and an oxide thereof.

When the first electrode EL1-1, EL1-2, and/or EL1-3 are a transflective electrode or reflective electrode, the first electrode EL1-1, EL1-2, and/or EL1-3 may include Ag, Mg, Cu, Al, Pt, Pd, Au, Ni, Nd, Ir, Cr, Li, Ca, LiF/Ca (stacking structure of LiF and Ca), LiF/Al (stacking structure of LiF and Al), Mo, Ti, W, or a compound or mixture thereof (for example, a mixture of Ag and Mg). In some embodiments, the first electrode EL1-1, EL1-2, and/or EL1-3 may have a multi-layered structure including a reflective film or transflective film formed (e.g., composed) of the above exemplified materials, and a transparent conductive film formed (e.g., composed) of indium tin oxide (ITO), indium zinc oxide (IZO), zinc oxide (ZnO), indium tin zinc oxide (ITZO), and/or the like. For example, in some embodiments, the first electrode EL1-1, EL1-2, and/or EL1-3 may be a transmissive electrode and may be formed (e.g., composed) of a transparent conductive oxide (TCO). In some embodiments, the first electrode EL1-1, EL1-2, and/or the EL1-3 may have a three-layered structure of ITO/Ag/ITO or a structure of Ti/Al/TIN, but embodiments of the present disclosure are not limited thereto. In embodiments of the present disclosure, a three-layered structure of A/B/C refers to that the A is a lowest layer (e.g., a first layer), and A, B, and C are sequentially stacked in the stated order.

The optical auxiliary layer OAL and the conductive layer CDL may be between the first electrode EL1 (e.g., first electrodes EL1-1, EL1-2, and EL1-3) and the hole transport region HTR. The optical auxiliary layer OAL may include an inorganic substance. The optical auxiliary layer OAL may be formed (e.g., composed) of an inorganic substance including silicon. For example, in one or more embodiments, the optical auxiliary layer OAL may include at least one of silicon oxide, silicon oxynitride, or silicon nitride. Because the optical auxiliary layer OAL including an inorganic substance is directly on the first electrode EL1 (e.g., first electrodes EL1-1, EL1-2, and EL1-3), the conductive layer CDL may be disposed on the optical auxiliary layer OAL to provide charges to the hole transport region HTR disposed on the optical auxiliary layer OAL. At least a portion of the conductive layer CDL may be in contact with the first electrodes EL1-1, EL1-2, and EL1-3.

The conductive layer CDL may have conductivity (e.g., as a conductor). The conductive layer CDL may be formed (e.g., composed) of a metal material, a metal alloy, and/or a conductive compound. For example, in one or more embodiments, the conductive layer CDL may be formed (e.g., composed) of a transparent conductive oxide (TCO). The conductive layer CDL may be formed (e.g., composed) of the same material as the material that the first electrodes EL1-1, EL1-2, and EL1-3 are formed (e.g., composed) of, or may be formed (e.g., composed) of a different material therefrom. For example, in some embodiments, the first electrodes EL1-1, EL1-2, and EL1-3 may be formed (e.g., composed) of a three-layered structure of ITO/Ag/ITO, and the conductive layer CDL may be formed (e.g., composed) of ITO. However, this is only an example, and the embodiment of the present disclosure is not limited thereto.

In the light emitting element ED, the hole transport region HTR may be provided on the conductive bed CDL. The hole transport region HTR may have a single-layered structure having a single layer formed (e.g., composed) of a single material, a single-layered structure having a single layer formed (e.g., composed) of a plurality of different materials, or a multi-layered structure having a plurality of layers formed (e.g., composed) of a plurality of different materials. For example, in one or more embodiments, the hole transport region HTR may include at least one selected from a phthalocyanine compound such as copper phthalocyanine, N1, N1'-([1,1'-biphenyl]-4,4'-diyl)bis(N1-phenyl-N4,N4-di-m-tolylbenzene-1,4-diamine) (DNTPD), 4,4',4"-[tris(3-methylphenyl)phenylamino]triphenylamine (m-MTDATA), 4,4',4"-Tris(N,N-diphenylamino)triphenylamine (TDATA), 4,4',4"-tris[N(2-naphthyl)-N-phenylamino]-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonic acid (PANI/CSA), Polyaniline/Poly(4-styrenesulfonate) (PANI/PSS), N,N'-di(naphthalen-1-yl)-N,N'-diphenyl-benzidine (NPB), triphenylamine-containing polyether ketone (TPAPEK), 4-Isopropyl-4'-methyldiphenyliodonium[Tetrakis(pentafluorophenyl)borate], dipyrazino[2,3-f: 2',3'-h]quinoxaline-2,3,6,7,10,11-hexacarbonitrile (HATCN), and/or the like.

In some embodiments, the hole transport region HTR may include at least one selected from a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl) triphenylamine (TCTA), 4,4'-Cyclohexylidene bis[N,N-bis (4-methylphenyl) benzenamine](TAPC), 4,4'-Bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-Bis(N-carbazolyl) benzene (mCP), 1,3-bis(1,8-dimethyl-9H-carbazol-9-yl) benzene (mDCP), and/or the like.

The hole transport region HTR may further include a charge generating material to improve conductivity in addition to the above-mentioned materials. The charge generating material may be substantially uniformly or non-uniformly dispersed in the hole transport region HTR. The charge generation material may be, for example, a p-dopant. The p-dopant may include at least one of a halogenated metal compound, a quinone derivative, a metal oxide, or a cyano group-containing compound, but embodiments of the present disclosure are not limited thereto. For example, in one or more embodiments, the p-dopant may be at least one selected from a halogenated metal compound such as CuI and RbI, a quinone derivative such as tetracyanoquinodimethane (TCNQ) and 2,3,5,6-tetrafluoro-7,7',8,8'-tetracyanoquinodimethane (F4-TCNQ), a metal oxide such as a tungsten oxide and a molybdenum oxide, a cyano group-containing compound such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), and/or the like, but embodiments of the present disclosure are not limited thereto.

The hole transport region HTR may include a hole injection layer HIL, a first hole transport layer HTL, and a first sub-hole control layer AIL-1, which are sequentially stacked in the stated order. In some embodiments, at least one of the hole injection layer HIL, the first hole transport layer HTL, or the first sub-hole control layer AIL-1 may not be provided. The hole injection layer HIL, the first hole transport layer HTL, and the first sub-hole control layer AIL-1 may include the compounds of the hole transport region HTR described above.

The first sub-hole control layer AIL-1 may be disposed adjacent to the first light emitting layer EML-1 configured to generate the first light. The first sub-hole control layer AIL-1 may be formed to have a highest occupied molecular orbital (HOMO) energy level and a lowest unoccupied molecular orbital (LUMO) energy level which facilitate the movement of holes. As such, an increase in the driving voltage of the first light emitting element ED-1 including the first sub-hole control layer AIL-1 may be prevented or reduced. In some embodiments, the first sub-hole control layer AIL-1 may block or reduce electrons moving from the first light emitting layer EML-1 to the hole transport region HTR. Therefore, the display panel DP including the first light emitting element ED-1 having the first sub-hole control layer AIL-1 may have improved display lifespan.

The electron transport region ETR may be provided on the light emitting auxiliary unit EAP. The electron transport region ETR may have a single-layered structure having a single layer formed (e.g., composed) of a single material, a single-layered structure having a single layer formed (e.g., composed) of a plurality of different materials, or a multi-layered structure having a plurality of layers formed (e.g., composed) of a plurality of different materials.

For example, in one or more embodiments, the electron transport region ETR may include an anthracene-based compound. However, embodiments of the present disclosure are not limited thereto, in some embodiments, the electron transport region ETR may include at least one selected from tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(biphenyl-4-yl)-4-phenyl-5-tert-butylphenyl-1,2,4-triazole (TAZ), 4-(naphthalen-1-yl)-3,5-diphenyl-4H-1,2,4-triazole (NTAZ), 2-(biphenyl-4-yl)-5-(4-tert-butylphenyl)-1,3,4-oxadiazole (tBu-PBD), bis(2-methyl-8-quinolinolato-N1,08)-(1,1'-biphenyl-4-olato) aluminum (BAlq), berylliumbis(benzoquinolin-10-olate) ($Bebq_2$), 9,10-di(naphthalen-2-yl)anthracene (ADN), 1,3-bis[3,5-di(pyridin-3-yl)phenyl]benzene (BmPyPhB), and a compound thereof.

In some embodiments, the electron transport region ETR may include a halogenated metal such as LiF, NaCl, CsF, RbCl, RbI, CuI, and KI, a lanthanum group metal such as Yb, or a co-deposition material of the above halogenated metal and the lanthanum group metal. For example, in some embodiments, the electron transport region ETR may include KI:Yb, RbI:Yb, LiF:Yb, and/or the like as the co-deposition material. In some embodiments, in the electron transport region ETR, a metal oxide such as $Li_2O$ and BaO, or 8-hydroxyl-Lithium quinolate (Liq) and/or the like may be utilized, but embodiments of the present disclosure are not limited thereto. In some embodiments, the electron transport region ETR may also be composed of a mixture of an electron transport material described above and an insulating organo metal salt. The organo metal salt may be a material having an energy band gap of about 4 eV or greater. For example, the organo metal salt may include metal acetate, metal benzoate, metal acetoacetate, metal acetylacetonate, and/or metal stearate.

In one or more embodiments, the electron transport region ETR may further include at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen), but embodiments of the present disclosure are not limited thereto.

In one or more embodiments, the electron transport region ETR may include a second buffer layer BUF-2, a first electron transport layer ETL, and an electron injection layer EIL. In some embodiments, at least one of the second buffer layer BUF-2, the first electron transport layer ETL, or the electron injection layer EIL may not be provided. The second buffer layer BUF-2, the first electron transport layer ETL, and the electron injection layer EIL may include the compounds of the electron transport region ETR described above. The second buffer layer BUF-2 may block or reduce holes moving from the third light emitting layer EML-3 to the electron transport region ETR.

In one or more embodiments, the light emitting auxiliary unit EAP disposed between the first light emitting layer EML-1 and the second light emitting layer EML-2 may include a first buffer layer BUF-1, a second electron transport layer ETL-A, a first charge generation layer (e.g., first charge generating layer) nCGL, a second charge generation layer (e.g., second charge generating layer) pCGL, a second hole transport layer HTL-A, and a second sub-hole control layer AIL-2, which are sequentially stacked in the stated order. The first charge generation layer nCGL may be an n-type or kind charge generation layer (or n-charge generating layer), and the second charge generation layer pCGL may be a p-type or kind charge generation layer (or p-charge generating layer). in some embodiments, at least one of the first buffer layer BUF-1, the second electron transport layer ETL-A, the first charge generation layer nCGL, the second charge generation layer pCGL, the second hole transport layer HTL-A, or the second sub-hole control layer AIL-2 may not be provided.

The second sub-hole control layer AIL-2 may include a material different from that of the first sub-hole control layer AIL-1 described above. The second sub-hole control layer AIL-2 may include a material which assists in generating the second light of the second light emitting layer EML-2, or a material which assists in generating the third light of the third light emitting layer EML-3. The first sub-hole control layer AIL-1 may include a material which assists in generating the first light of the first light emitting layer EML-1. However, embodiments of the present disclosure are not limited thereto, in some embodiments, the first sub-hole control layer AIL-1 and the second sub-hole control layer AIL-2 may include the same material.

The second sub-hole control layer AIL-2 may be disposed adjacent to the third light emitting layer EML-3 configured to generate the third light or the second light emitting layer EML-2 configured to generate the second light. In one or more embodiments, the second sub-hole control layer AIL-2 may be formed to have a highest occupied molecular orbital (HOMO) energy level and a lowest unoccupied molecular orbital (LUMO) energy level which facilitate the movement of holes. Accordingly, an increase in the driving voltage of the second light emitting element ED-2 including the second sub-hole control layer AIL-2 may be prevented or reduced. In some embodiments, the second sub-hole control layer AIL-2 may block or reduce electrons moving from the second light emitting layer EML-2 or the third light emitting layer EML-3 to the second hole transport layer HTL-A. Therefore, the display panel DP including the second light emitting element ED-2 having the second sub-hole control layer AIL-2 may have improved display lifespan.

The second electrode EL2 may be provided on the electron transport region ETR. The second electrode EL2 may be a common electrode. The second electrode EL2 may be a cathode or an anode, but embodiments of the present disclosure are not limited thereto. For example, in some embodiments, the first electrode EL1-1, EL1-2, and/or EL1-3 may be an anode, and the second electrode EL2 may be a cathode. In some embodiments, the first electrode EL1-1, EL1-2, and/or EL1-3 may be a cathode, and the second electrode EL2 may be an anode.

The second electrode EL2 may include at least one selected from Ag, Mg, Cu, Al, Pt, Pd, Au, Ni, Nd, Ir, Cr, Li, Ca, LiF, Mo, Ti, W, In, Sn, or Zn, a compound of two or more selected therefrom, a mixture of two or more selected therefrom, and an oxide thereof. The second electrode EL2 may be a transmissive electrode, a transflective electrode, or a reflective electrode. When the second electrode EL2 is a transmissive electrode, the second electrode EL2 may be formed (e.g., composed) of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or reflective electrode, the second electrode EL2 may include at least one selected from Ag, Mg, Cu, Al, Pt, Pd, Au, Ni, Nd, Ir, Cr, Li, Ca, LiF/Ca, LiF/Al, Mo, Ti, Yb, W, and a compound or a mixture thereof (for example, AgMg, AgYb, or MgYb). In some embodiments, the second electrode EL2 may have a multi-layered structure including a reflective film or transflective film formed (e.g., composed) of the above exemplified materials, and a transparent conductive film formed (e.g., composed) of indium tin oxide (ITO), indium zinc oxide (IZO), zinc oxide (ZnO), indium tin zinc oxide (ITZO), and/or the like. For example, in one or more embodiments, the second electrode EL2 may include any one of the above-described metal materials, a combination of two or more selected from the above-described metal materials, an oxide of any one of the above-described metal materials, and/or the like.

On the second electrode EL2, a capping layer CPL may be disposed and provided. The capping layer CPL may include multilayers, or a single layer. The capping layer CPL may be an organic layer and/or an inorganic layer. For example, in some embodiments, when the capping layer CPL includes an inorganic substance, the inorganic substance may include an alkaline metal compound such as LiF, an alkaline earth metal compound such as $MgF_2$, SiON, $SiN_x$, $SiO_y$, and/or the like. In some embodiments, when the capping layer CPL includes an organic substance, the organic substance may include at least one selected from α-NPD, NPB, TPD, m-MTDATA, $Alq_3$, CuPc, N4, N4, N4', N4'-tetra (biphenyl-4-yl) biphenyl-4,4'-diamine (TPD15), 4,4',4"-Tris (carbazol-9-yl) triphenylamine (TCTA), and/or the like, or may include an epoxy resin and/or an acrylate such as a methacrylate.

In one or more embodiments, the first light emitting layer EML-1 may be disposed on the hole transport region HTR. The second light emitting layer EML-2 may be disposed on the light emitting auxiliary unit EAP. The third light emitting layer EML-3 may be disposed between the second light emitting layer EML-2 and the light emitting auxiliary unit EAP. However, this is only an example, and embodiments of the present disclosure are not limited thereto. For example, referring to FIG. 5B, in the light emitting element ED-a of one or more embodiments, a first light emitting layer EML-1 may be disposed on a hole transport region HTR, a second light emitting layer EML-2 may be disposed on a light emitting auxiliary unit EAP, and a third light emitting layer EML-3 may be disposed between the first light emitting layer EML-1 and the light emitting auxiliary unit EAP. For example, as illustrated in FIG. 5B, the light emitting element ED-a may include a light emitting unit EP-1 which includes a hole transport region HTR, a first light emitting layer EML-1, a third light emitting layer EML-3, a light emitting auxiliary unit EAP, a second light emitting layer EML-2, and an electron transport region ETR, which are sequentially stacked in the stated order. The light emitting element ED-a illustrated in FIG. 5B differs from the light emitting element ED illustrated in FIG. 5A only in the position of the third light emitting element EML-3, and the description of the light emitting element ED illustrated in FIG. 5A may be equally applied to the light emitting element ED-a illustrated in FIG. 5B. Hereinafter, the description will be given based on the light emitting element ED illustrated in FIG. 5A.

In one or more embodiments, the first light emitting layer EML-1 may generate blue light, the second light emitting layer EML-2 may generate red light, and the third light emitting layer EML-3 may generate green light. In one or more embodiments, the first light emitting layer EML-1 may generate green light, the second light emitting layer EML-2 may generate blue light, and the third light emitting layer EML-3 may generate red light. In one or more embodiments, the first light emitting layer EML-1 may generate red light, the second light emitting layer EML-2 may generate green light, and the third light emitting layer EML-3 may generate blue light.

In one or more embodiments, the light emitting element ED may include an optical auxiliary layer OAL and a conductive layer CDL. Accordingly, the blue light may perform a sixth-order resonance, the red light may perform a fourth-order resonance, and the green light may perform a third-order resonance.

Equation 1 shows the thickness of a thin film required for n-th-order resonance of red light, green light, and blue light. The variable "n" is/represents an integer of 2 to 6. The thickness of the thin film required for the n-th-order resonance of the red light, the green light, and the blue light may be referred to as a distance at which the red light, the green light, and the blue light resonate. The thin film may include components disposed between the first electrode EL1-1, EL1-2, or EL1-3 and the second electrode EL2. For example, the thin film may include a conductive layer CDL, light emitting layers EML-1, EML-2, and EML-3, a hole transport region HTR, a light emitting auxiliary unit EAP, an electron transport region ETR, and an optical auxiliary region OAL. The thickness of the thin film may be obtained by adding two or more thicknesses among a thickness of the conductive layer CDL, a thickness of the hole transport region HTR, thicknesses of the light emitting layers EML-1, EML-2, and EML-3, a thickness of the light emitting auxiliary unit EAP, a thickness of the electron transport region ETR, and a thickness of the optical auxiliary layer OAL.

$$B2<G2<R2\cong B3<G3<B4<R3<G4\cong B5<R4\cong G5\cong B6 \quad \text{Equation 1}$$

In Equation 1, Bn represents a thin film thickness required for blue light to perform an n-th-order resonance, and for example, B2 refers to a thin film thickness required for blue light to perform a second-order resonance. Gn represents a thin film thickness required for green light to perform an n-th-order resonance, and for example, G2 refers to a thin film thickness required for green light to perform a second-order resonance. Rn represents a thin film thickness required for red light to perform an n-th-order resonance, and for example, R2 refers to a thin film thickness required for red light to perform a second-order resonance.

Referring to Equation 1, it can be seen that the thin film thicknesses G2 and R2 respectively required for the green light and the red light to perform the second-order resonance are thicker than the thin film thickness B2 required for the blue light to perform the second-order resonance. It can be seen that the thin film thickness R2 required for the red light to perform the second-order resonance is similar to the thin film thickness B3 required for the blue light to perform a third-order resonance. In addition, the thin film thickness B6 required for the blue light to perform a sixth-order resonance is greater than the thin film thickness R2 required for the red light to perform the second-order resonance and the thin film thickness G3 required for the green light to perform a third-order resonance.

For example, in one or more embodiments, the thickness of each of the conductive layer CDL, the hole transport region HTR, the light emitting auxiliary unit EAP, the electron transport region ETR, and the optical auxiliary layer OAL included in the first to the third light emitting elements ED-1, ED-2, and ED-3 may be provided to allow the red light to perform a fourth-order resonance, the green light to perform the third-order resonance, and the blue light to perform the sixth-order resonance. Accordingly, the display panel DP of one or more embodiments may exhibit excellent or suitable display efficiency and improved display lifespan.

For example, in one or more embodiments, a thickness TH1 of the optical auxiliary layer OAL may be about 150 nm to about 200 nm. When the thickness TH1 of the optical auxiliary layer OAL is less than about 150 nm, the resonance of the red light is not achieved, so that there is a problem in that the intensity of the red light may be low. When the thickness TH1 of the optical auxiliary layer OAL is greater than about 200 nm, there is a problem in that the intensity of the red light and the intensity of the green light may be low. For example, in one or more embodiments, when the thickness TH1 of the optical auxiliary layer OAL is about 150 nm to about 200 nm, the light emission intensity of each of the blue light, red light, and green light has a maximum value, so that the display panel DP including the light emitting element ED having the auxiliary layer OAL of one or more embodiments may exhibit excellent or suitable display efficiency and improved display lifespan. In one or more embodiments, when the thickness TH1 of the optical auxiliary layer OAL is about 150 nm to about 200 nm, the blue light emitted from the light emitting element ED of one embodiment may perform the sixth-order resonance, the red light emitted therefrom may perform the fourth-order resonance, and the green light emitted therefrom may perform the third-order resonance.

In the display panel DP including the optical auxiliary layer OAL of one or more embodiments, the blue light may perform the sixth-order resonance, the red light may perform the fourth-order resonance, and the green light may perform the third-order resonance. As such, the display panel DP of one or more embodiments may exhibit excellent or suitable display efficiency and improved display lifespan.

In one or more embodiments, unlike what is illustrated in FIG. 5A and FIG. 5B, a light emitting element ED-b illustrated in FIG. 5C differs in that the light emitting element ED-b may include two light emitting auxiliary units EAP-1 and EAP-2. The light emitting element ED-b of one or more embodiments may include a light emitting unit EP-2 which includes two light emitting auxiliary units EAP-1 and EAP-2. The light emitting unit EP-2 of one or more embodiments may include a hole transport region HTR, a first light emitting layer EML-1, a first light emitting auxiliary unit EAP-1, a second light emitting layer EML-2, a second light emitting auxiliary unit EAP-2, a third light emitting layer EML-3, and an electron transport region ETR, which are sequentially stacked in the stated order in a thickness direction.

The first light emitting auxiliary unit EAP-1 may include a first buffer layer BUF-1, a second electron transport layer ETL-A1, a first charge generation layer (or first charge generating layer) nCGL-1, a second charge generation layer (or second charge generating layer) pCGL-1, a second hole transport layer HTL-A1, and a second sub-hole control layer AIL-2, which are sequentially stacked in the stated order. The first charge generation layer nCGL-1 may be an n-type or kind charge generation layer (e.g., n-charge generating layer), and the second charge generation layer pCGL-1 may be a p-type or kind charge generation layer (e.g., p-generating layer). In some embodiments, at least one of the first buffer layer BUF-1, the second electron transport layer ETL-A1, the first charge generation layer nCGL-1, the second charge generation layer pCGL-1, the second hole transport layer HTL-A1, or the second sub-hole control layer AIL-2 may not be provided.

In one or more embodiments, the second sub-hole control layer AIL-2 may include a material different from that of the first sub-hole control layer AIL-1 described above. The second sub-hole control layer AIL-2 may include a material which assists in generating the second light of the second light emitting layer EML-2, and the first sub-hole control layer AIL-1 may include a material which assists in generating the first light of the first light emitting layer EML-1. However, embodiments of the present disclosure are not limited thereto, in some embodiments, the first sub-hole control layer AIL-1 and the second sub-hole control layer AIL-2 may include the same material. The second sub-hole control layer AIL-2 may be disposed adjacent to the second light emitting layer EML-2 configured to generate the second light. The second sub-hole control layer AIL-2 may be formed to have a highest occupied molecular orbital (HOMO) energy level and a lowest unoccupied molecular orbital (LUMO) energy level which facilitate the movement of holes. Accordingly, an increase in the driving voltage of the light emitting device ED-b including the second sub-hole control layer AIL-2 may be prevented or reduced. In one or more embodiments, the second sub-hole control layer AIL-2 may block or reduce electrons moving from the second light emitting layer EML-2 to the second hole transport layer HTL-A1. Therefore, the display panel DP including the light emitting element ED-b having the second sub-hole control layer AIL-2 may have improved display lifespan.

The second light emitting auxiliary unit EAP-2 may include a third buffer layer BUF-3, a third electron transport layer ETL-A2, a third charge generation layer (or third charge generating layer) nCGL-2, a fourth charge generation layer (or fourth charge generating layer) pCGL-2, a third hole transport layer HTL-A2, and a third sub-hole control layer AIL-3, which are sequentially stacked in the stated order. The third charge generation layer nCGL-2 may be an n-type or kind charge generation layer (e.g., n-type charge generating layer), and the fourth charge generation layer pCGL-2 may be a p-type or kind charge generation layer (e.g., p-type charge generating layer). In some embodiments, at least one of the third buffer layer BUF-3, the third electron transport layer ETL-A2, the third charge generation layer nCGL-2, the fourth charge generation layer pCGL-2, the third hole transport layer HTL-A2, or the third sub-hole control layer AIL-3 may not be provided.

In one or more embodiments, the third sub-hole control layer AIL-3 may include a material different from those of the first and second sub-hole control layers AIL-1 and AIL-2. The third sub-hole control layer AIL-3 may include a material which assists in generating the third light of the third light emitting layer EML-3. However, embodiments of the present disclosure are not limited thereto, in some embodiments, the third sub-hole control layer AIL-3 may include the same material as that of at least one selected from the first and second sub-hole control layers AIL-1 and AIL-2. For example, at least one selected from the first to the third sub-hole control layers AIL-1, AIL-2, and AIL-3 may include a triphenylamine-based compound.

The third sub-hole control layer AIL-3 may be disposed adjacent to the third light emitting layer EML-3 configured to generate the third light. The third sub-hole control layer AIL-3 may be formed to have a highest occupied molecular orbital (HOMO) energy level and a lowest unoccupied molecular orbital (LUMO) energy level which facilitate the movement of holes. Accordingly, an increase in the driving voltage of the light emitting device ED-b including the third sub-hole control layer AIL-3 may be prevented or reduced. In one or more embodiments, the third sub-hole control layer AIL-3 may block or reduce electrons moving from the third light emitting layer EML-3 to the third hole transport layer HTL-A2. Therefore, the display panel DP including the light emitting element ED-b having the third sub-hole control layer AIL-3 may have improved display lifespan. For example, in one or more embodiments, a thickness TH1 of the optical auxiliary layer OAL may be about 150 nm to about 200 nm. When the thickness TH1 of the optical auxiliary layer OAL is less than about 150 nm, the resonance of the red light is not achieved, so that there is a problem in that the intensity of the red light may be low. When the thickness TH1 of the optical auxiliary layer OAL is greater than about 200 nm, there is a problem in that the intensity of the red light and the intensity of the green light may be low. For example, in one or more embodiments, when the thickness TH1 of the optical auxiliary layer OAL is about 150 nm to about 200 nm, the light emission intensity of each of the blue light, red light, and green light has a maximum value, so that the display panel DP including the light emitting element ED having the auxiliary layer OAL may exhibit excellent or suitable display efficiency and improved display lifespan. In one or more embodiments, when the thickness TH1 of the optical auxiliary layer OAL is about 150 nm to about 200 nm, the blue light emitted from the light emitting element ED may perform the sixth-order resonance, the red light emitted therefrom may perform the fourth-order resonance, and the green light emitted therefrom may perform the third-order resonance.

In one or more embodiments, the sum of a thickness TH2 of the conductive layer CDL, a thickness TH3 of the hole transport region HTR, a thickness TH4-1 of the first light emitting auxiliary unit EAP-1, a thickness TH4-2 of the second light emitting auxiliary unit EAP-2, and a thickness TH5 of the electron transport region ETR may be about 50 nm to about 250 nm. When the sum of the thickness TH2 of the conductive layer CDL, the thickness TH3 of the hole transport region HTR, the thickness TH4-1 of the first light emitting auxiliary unit EAP-1, the thickness TH4-2 of the second light emitting auxiliary unit EAP-2, and the thickness TH5 of the electron transport region ETR is about 50 nm to about 250 nm, an increase in drive voltage may be minimized or reduced and the generation of light in the first to the third light emitting layers EML-1, EML-2 and EML-3 may be facilitated. When the sum of the thickness TH2 of the conductive layer CDL, the thickness TH3 of the hole transport region HTR, the thickness TH4-1 of the first light emitting auxiliary unit EAP-1, the thickness TH4-2 of the light emitting auxiliary unit EAP-2, and the thickness TH5 of the electron transport region ETR is greater than about 250 nm, an increase in the thickness of a display panel and an increase in the driving voltage thereof may be caused. When the sum of the thickness TH2 of the conductive layer CDL, the thickness TH3 of the hole transport region HTR, the thickness TH4-1 of the first light emitting auxiliary unit EAP-1, the thickness TH4-2 of the light emitting auxiliary unit EAP-2, and the thickness TH5 of the electron transport region ETR is less than about 50 nm, first to third light emitting layers may not be composed of layers containing materials necessary for generating light.

Figure 6A:
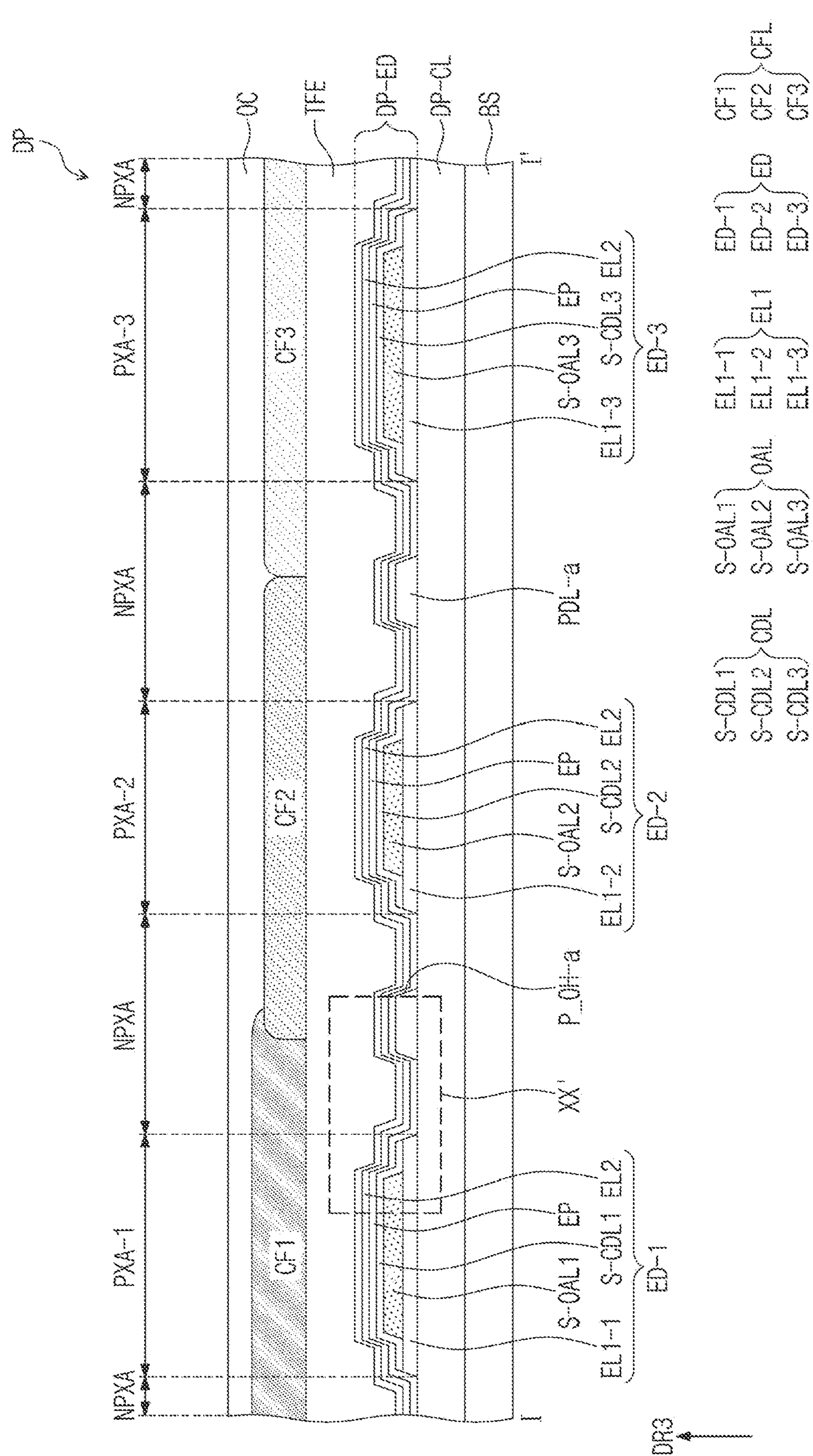
FIG. 6A is a cross-sectional view of a display panel according to one or more embodiments of the present disclosure.
Figure 6B:
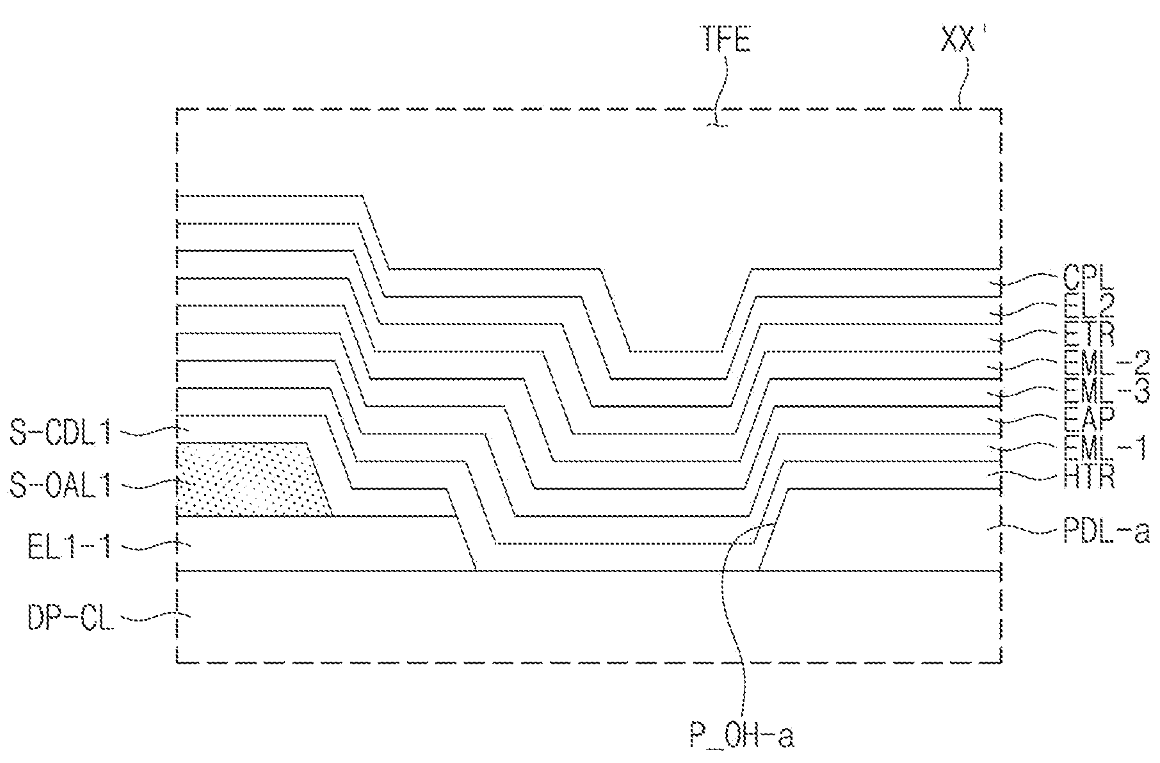
FIG. 6B is a view of an enlarged portion of a display panel according to one or more embodiments of the present disclosure.
Figure 7:
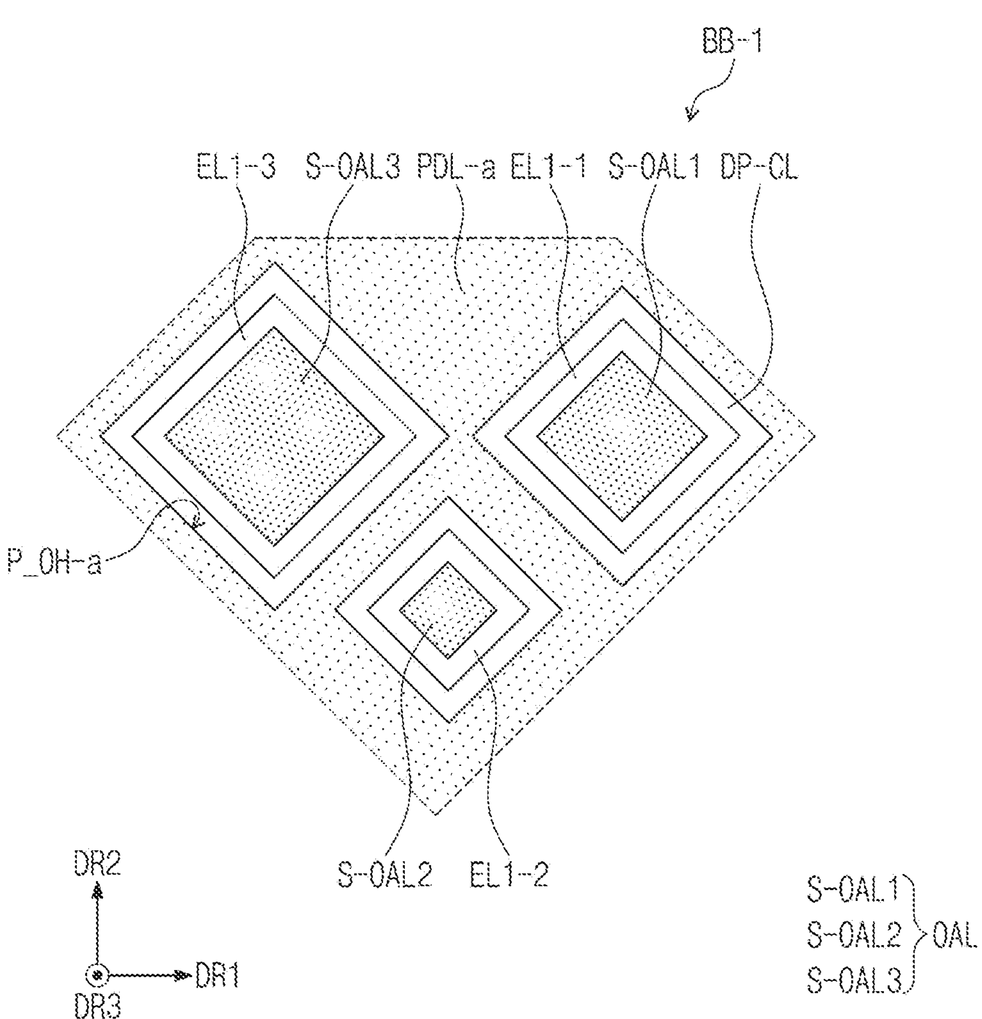
FIG. 7 is a plan view showing a portion of a display device of one or more embodiments of the present disclosure.

FIG. 6A is a cross-sectional view of a display panel according to one or more embodiments of the present disclosure. FIG. 6B is a view of an enlarged portion of a display panel according to one or more embodiments of the present disclosure. FIG. 7 is a plan view of a portion of a display panel according to one or more embodiments of the present disclosure. FIG. 6A, FIG. 6B, and FIG. 7 are each a cross-sectional or plan views showing a display panel of one or more embodiments and illustrate that a pixel definition film PDL-a is spaced (e.g., spaced apart) from first electrode EL1-1, EL1-2, or EL1-3. FIG. 6A is a cross-sectional view of a display panel of one or more embodiments taken along line I-I' illustrated in FIG. 3. FIG. 6B is a view of an enlarged portion corresponding to XX' illustrated in FIG. 6A.

Compared to FIG. 4A and FIG. 4B, there is a different in that the pixel definition film PDL-a of FIG. 6A, FIG. 6B, and FIG. 7 is spaced apart from the first electrode EL1-1, EL1-2, or EL1-3. In describing with reference to FIG. 6A, FIG. 6B, and FIG. 7, the same content as those described with reference to FIG. 1 to FIG. 5B will not be described again, and instead, differences will be mainly described.

Referring to FIG. 6A, FIG. 6B, and FIG. 7, in one direction perpendicular to the thickness direction axis DR3, the pixel definition film PDL-a and the first electrode EL1-1, EL1-2, or EL1-3 may be spaced apart from each other with a light emitting unit EP interposed therebetween. The light emitting unit EP illustrated in FIG. 6A may include the configuration of the light emitting unit EP described with reference to FIG. 5A as it is. For example, referring to FIG. 6A and FIG. 6B, the light emitting unit EP may include a hole transport region HTR, a first light emitting layer EML-1 (see FIG. 5A), a light emitting auxiliary unit EAP (see FIG. 5A), a second light emitting layer EML-2 (see FIG. 5A), a third light emitting layer EML-3 (see FIG. 5A), and an electron transport region ETR (see FIG. 5A), which are sequentially stacked in the stated order.

The hole transport region HTR may be disposed on a circuit layer DP-CL in a portion not overlapping the pixel definition film PDL-a and the first electrode EL1-1, EL1-2, or EL1-3. The light emitting unit EP may be in contact with the circuit layer DP-CL in the portion not overlapping the pixel definition film PDL-a and the first electrode EL1-1, EL1-2, or EL1-3. The circuit layer DP-CL may include an exposed portion exposed from the first electrode EL1-1, EL1-2, or EL1-3 and from the pixel definition film PDL-a adjacent to the first electrode EL1-1, EL1-2, or EL1-3, wherein the exposed portion and the hole transport region HTR may be in contact with each other.

A pixel opening P_OH-a may be defined between the pixel definition films PDL-a. The first electrode EL1-1, EL1-2, or EL1-3 and an optical auxiliary layer OAL may be disposed on the circuit layer DP-CL within the pixel opening P_OH-a.

In one or more embodiments, the pixel definition film PDL-a spaced apart from the first electrode EL1-1, EL1-2, or EL1-3 may be formed (e.g., composed) of the same material as the material of which the optical auxiliary layer OAL is formed (e.g., composed). For example, in one or more embodiments, the pixel definition film PDL-a illustrated in FIG. 6A, FIG. 6B, and FIG. 7 may include a silicon-based inorganic substance. For example, in some embodiments, the pixel definition film PDL-a illustrated in FIG. 6A, FIG. 6B, and FIG. 7 may include at least one of silicon nitride, silicon oxynitride, or silicon oxide. The display panel DP of one or more embodiments may include the pixel definition film PDL-a, so that color mixing due to side leakage between adjacent light emitting elements ED-1, ED-2, and ED-3 may be prevented or reduced.

Referring to FIG. 6A, the display panel DP may include a base layer BS, a circuit layer DP-CL on the base layer BS, a display element layer DP-ED on the circuit layer DP-CL, and an encapsulation layer TFE on the display element layer DP-ED. In some embodiments, the display panel DP may further include a color filter layer CFL on the encapsulation layer TFE. In some embodiments, the display panel DP may further include an organic layer OC on the color filter layer CFL. The organic later may include at least one of an acrylic-based resin, a silicone-based resin, or an epoxy-based resin.

Figure 8:
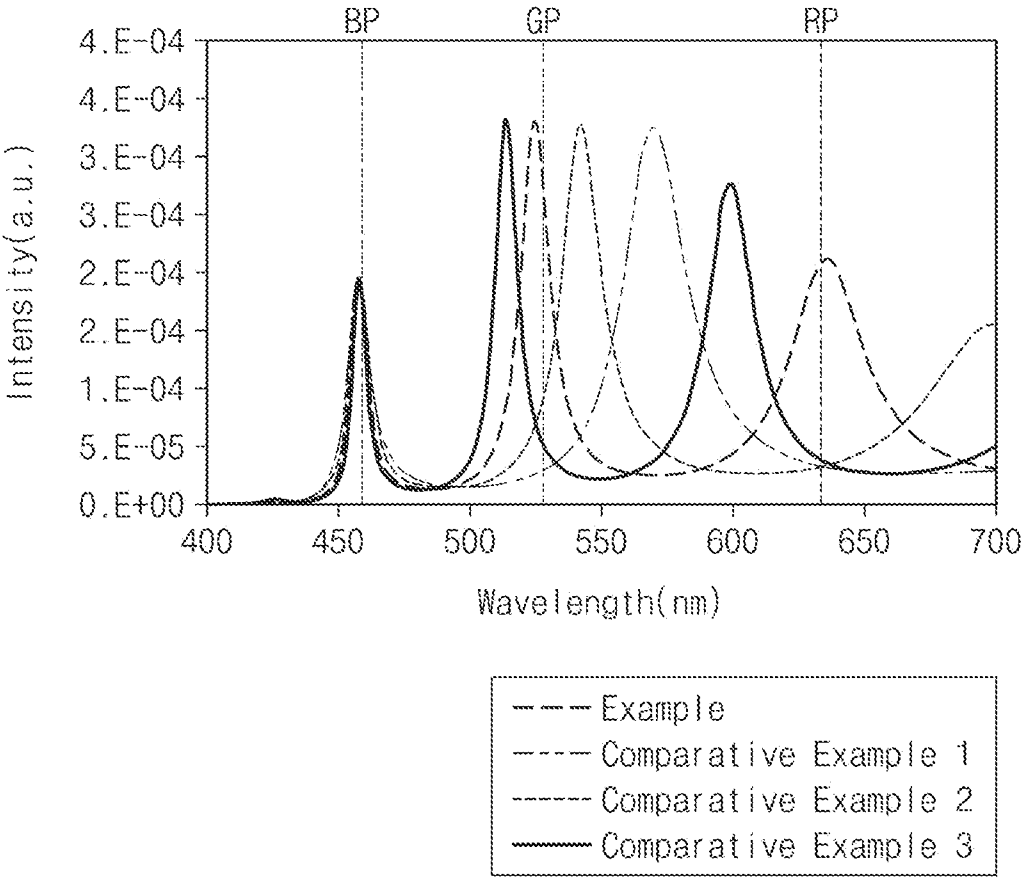
FIG. 8 is a view showing a light emission spectrum of light emitted from display panels of Example and Comparative Examples.

FIG. 8 is a view showing a light emission spectrum of light emitted from display panels according to Example and Comparative Examples of the present disclosure. In FIG. 8, Example and Comparative Examples are the measurement of a light emission spectrum utilizing a display panel including a light emitting element having the configuration illustrated in FIG. 5A.

For example, each of Example and Comparative Examples is a display panel including a light emitting element in which the first light emitting layer EML-1 (FIG. 5A) emits blue light, the second light emitting layer EML-2 (see FIG. 5A) emits red light, and the third light emitting layer EML-3 (see FIG. 5A) emits green light. Example is an embodiment in which the blue light performs a sixth-order resonance. Comparative Example 1 is an embodiment in which the blue light performs a fourth-order resonance. Comparative Example 2 is an embodiment in which the blue light performs a fifth-order resonance. Comparative Example 3 is an embodiment in which the blue performs a seventh-order resonance. Comparative Example 1 is an embodiment in which an optical auxiliary layer is not included. Comparative Example 2 is an embodiment in which the thickness of an optical auxiliary layer is less than about 150 nm. Comparative Example 3 is an embodiment in which the thickness of an optical auxiliary layer is greater than about 200 nm. Example is an embodiment in which the thickness of an optical auxiliary layer is about 150 nm to about 200 nm.

In FIG. 8, a red highest peak RP, a green highest peak GP, and a blue highest peak BP are shown. When high light emitting intensity is exhibited at each of the red highest peak RP, the green highest peak GP, and the blue highest peak BP, a display panel may exhibit excellent or suitable display efficiency and display lifespan.

In the case of Example, it can be seen that high light emitting intensity is exhibited at each of the red highest peak RP, the green highest peak GP, and the blue highest peak BP. In the case of Comparative Examples 1 and 2, it can be seen that light emission did not occur in the vicinity of the red highest peak RP. It can be seen that Comparative Example 3 exhibits lower light emitting intensity than Example at each of the red highest peak RP and the green highest peak GP. For example, the display panel of Example exhibits high light emitting intensity at each of the red highest peak RP, the green highest peak GP, and the blue highest peak BP compared to the display panels of Comparative Examples 1 to 3, and thus may exhibit excellent or suitable display efficiency and display lifespan.

Table 1 shows the CIE color coordinates, driving voltage, and light efficiency of the display panel according to each of Example 1, Example 2, Comparative Example 4, and Comparative Example 5. The display panel according to each of Example 1, Example 2, Comparative Example 4, and Comparative Example 5 includes a color filter layer on (e.g., on each of) first to third light emitting elements, wherein first light, second light, or third light is emitted through the color filter layer. A first filter disposed on the first light emitting element is to emit the first light, a second filter disposed on the second light emitting element is to emit the second light, and a third filter disposed on the third light emitting element is to emit the third light. Each of the first to the third lights is blue light, red light, or green light.

In Table 1, the first driving voltage was measured in a light emitting element corresponding to a filter from which the blue light was emitted among the first to the third light emitting elements. The second driving voltage was measured in a light emitting element corresponding to a filter from which the green light was emitted among the first to the third light emitting elements. The third driving voltage was measured in a light emitting element corresponding to a filter from which the red light was emitted among the first to the third light emitting elements.

Example 1 and Example 2 are display panels including an optical auxiliary layer having a thickness of about 192 nm. Comparative Example 4 and Comparative Example 5 are display panels which do not include an optical auxiliary layer. Example and Example 2 (each) include an optical auxiliary layer having a thickness of about 192 nm, and thus has a structure in which the blue light performs a sixth-order resonance. Meanwhile, Example 1 and Comparative Example 4 are display panels (each) including a capping layer having a thickness of about 60 nm, and Example 2 and Comparative Example 5 are display panels (each) including a capping layer having a thickness of about 40 nm.

TABLE 1

| | First driving voltage | Blue light, color coordinate y | Blue light efficiency |
|---|---|---|---|
| Example 1 | 6.9 | 0.040 | 81.0 |
| Example 2 | 6.9 | 0.038 | 74.4 |
| Comparative Example 4 | 6.9 | 0.043 | 71.1 |
| Comparative Example 5 | 6.9 | 0.045 | 76.0 |
| | **Second driving voltage** | **Green light, color coordinate x** | **Green light efficiency** |
| Example 1 | 6.7 | 0.236 | 41.8 |
| Example 2 | 6.7 | 0.241 | 41.4 |
| Comparative Example 4 | 7.2 | 0.327 | 24.9 |
| Comparative Example 5 | 7.4 | 0.296 | 25.1 |
| | **Third driving voltage** | **Red light, color coordinate x** | **Red light efficiency** |
| Example 1 | 8.3 | 0.670 | 17.5 |
| Example 2 | 7.8 | 0.669 | 18.2 |
| Comparative Example 4 | 8.3 | 0.667 | 3.5 |
| Comparative Example 5 | 7.8 | 0.671 | 5.9 |
| | **White light efficiency** | **Color match rate (DCI, 1931)** | **Color match rate (sRGB, 1931)** |
| Example 1 | 13.0 | 100.0% | 99.9% |
| Example 2 | 12.8 | 100.0% | 99.6% |
| Comparative Example 4 | 6.6 | 86.4% | 100.0% |
| Comparative Example 5 | 9.1 | 86.6% | 99.4% |

Referring to Table 1, it can be seen that Example 1 and Example 2 (each) exhibit an equivalent level of blue light efficiency, and relatively excellent or suitable green light efficiency and red light efficiency compared to Comparative Example 4 and Comparative Example 5. As a result, Example 1 and Example 2 (each) exhibit high white light efficiency and a high color match rate compared to Comparative Example 4 and Comparative Example 5. The results correspond to the high light emitting intensity exhibited at each of the red highest peak RP, the green highest peak GP, and the blue highest peak BP in the graph shown in FIG. 8. That is, the display panel of one or more embodiments includes an optical auxiliary layer having a thickness of about 150 nm to about 200 nm, and thus may exhibit high display efficiency and display lifespan. In addition, the display panel of one or more embodiments includes the optical auxiliary layer having a thickness of about 150 nm to about 200 nm, and thus may exhibit a high color match rate.

An electronic apparatus according to one or more embodiments of the present disclosure may include a display panel including an optical auxiliary layer, and thus, may exhibit excellent or suitable display efficiency and display lifespan.

As utilized herein, the singular forms "a," "an," "one," and "the" are intended to include the plural forms as well, unless the context clearly indicates otherwise. Further, the use of "may" when describing embodiments of the present disclosure refers to "one or more embodiments of the present disclosure".

As utilized herein, the terms "substantially," "about," "~," or similar terms are used as terms of approximation and not as terms of degree, and are intended to account for the inherent deviations in measured or calculated values that would be recognized by those of ordinary skill in the art. "About" as used herein ("~"), is inclusive of (includes) the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display panel, the display element, the light-emitting element, the electronic apparatus, or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the present disclosure has been described with reference to one or more embodiments of the present disclosure, it will be understood by those skilled in the art that one or more suitable modifications and changes in form and details may be made therein without departing from the spirit and scope of the present disclosure as set forth in the following claims and equivalents thereof.

Accordingly, the technical scope of the present disclosure is not intended to be limited to the contents set forth in the detailed description of the specification, but is intended to be defined by the appended claims and equivalents thereof.

What is claimed is:

1. A display panel comprising:

a circuit layer;

a pixel definition film on the circuit layer; and a display element layer comprising first to third light emitting elements divided by the pixel definition film and configured to emit white light, wherein each of the first to the third light emitting elements comprises:

a first electrode;

an optical auxiliary layer on the first electrode;

a conductive layer on the optical auxiliary layer;

a hole transport region on the conductive layer;

a first light emitting layer on the hole transport region and configured to emit first light;

a light emitting auxiliary unit on the first light emitting layer;

a second light emitting layer on the light emitting auxiliary unit and configured to generate second light different from the first light;

a third light emitting layer either between the first light emitting layer and the light emitting auxiliary unit or between the light emitting auxiliary unit and the second light emitting layer and configured to generate third light different from each of the first light and the second light;

an electron transport region on the second light emitting layer; and a second electrode on the electron transport region, wherein the display panel comprises one or both selected from among: (A) the conductive layer covering the optical auxiliary layer and being in contact with a surface of the first electrode; and (B) the circuit layer comprising an exposed portion exposed from the first electrode and from the pixel definition film adjacent to the first electrode, and the hole transport region being in contact with the exposed portion.

2. The display panel of claim 1, wherein the optical auxiliary layer in each of the first to the third light emitting elements has the same thickness.

3. The display panel of claim 1, wherein the optical auxiliary layer comprises at least one of silicon oxide, silicon oxynitride, or silicon nitride.

4. The display panel of claim 1, wherein a thickness of the optical auxiliary layer is about 150 nm to about 200 nm.

5. The display panel of claim 1, wherein the sum of thicknesses of the conductive layer, the hole transport region, the light emitting auxiliary unit, and the electron transport region is about 50 nm to about 250 nm.

6. The display panel of claim 1, wherein a light selected from among the first to the third lights is to perform a sixth-order resonance, another light thereof is to perform a fourth-order resonance, and the reminder light thereof is to perform a third-order resonance.

7. The display panel of claim 1, wherein the pixel definition film is spaced from the first electrode, and composed of the same material as a material of which the optical auxiliary layer is composed.

8. The display panel of claim 1, further comprising a color filter layer comprising a first filter overlapping the first light emitting element, a second filter overlapping the second light emitting element, and a third filter overlapping the third light emitting element, and on the display element layer, and wherein:

the first filter is to transmit red light;

the second filter is to transmit green light; and the third filter is to transmit blue light.

9. The display panel of claim 1, wherein:

the first light is blue light;

the second light is red light; and the third light is green light.

10. The display panel of claim 1, wherein:

one selected from among the first light and the third light is red light, and the other one thereof is green light; and the second light is blue light.

11. An electronic apparatus comprising:

a display panel; and a lens unit facing the display panel, wherein the display panel comprises a circuit layer and a display element layer on the circuit layer, wherein the display element layer comprises:

a pixel definition film on the circuit layer; and first to third light emitting elements divided by the pixel definition film and configured to emit white light, wherein each of the first to the third light emitting elements comprises:

a first electrode;

an optical auxiliary layer on the first electrode;

a conductive layer on the optical auxiliary layer;

a hole transport region on the conductive layer;

a first light emitting layer on the hole transport region and configured to emit first light;

a light emitting auxiliary unit on the first light emitting layer;

a second light emitting layer on the light emitting auxiliary unit and configured to generate second light different from the first light;

a third light emitting layer either between the first light emitting layer and the light emitting auxiliary unit or between the light emitting auxiliary unit and the second light emitting layer and configured to generate third light different from each of the first light and the second light;

an electron transport region on the second light emitting layer; and a second electrode on the electron transport region, wherein the electronic apparatus comprises one or both selected from among: (A) the conductive layer covering the optical auxiliary layer and being in contact with a surface of the first electrode; and (B) the circuit layer comprising an exposed portion exposed from the first electrode and from the pixel definition film adjacent to the first electrode, and the hole transport region being in contact with the exposed portion.

12. The electronic apparatus of claim 11, wherein the optical auxiliary layer in each of the first to the third light emitting elements has the same thickness.

13. The electronic apparatus of claim 11, wherein the optical auxiliary layer comprises at least one of silicon oxide, silicon oxynitride, or silicon nitride.

14. The electronic apparatus of claim 11, wherein a thickness of the optical auxiliary layer is about 150 nm to about 200 nm.

15. The electronic apparatus of claim 11, wherein:

the first light is to perform a sixth-order resonance;

the second light is to perform a fourth-order resonance; and the third light is to perform a third-order resonance.

16. The electronic apparatus of claim 11, wherein the pixel definition film is spaced from the first electrode and composed of the same material as a material of which the optical auxiliary layer is composed.

17. The electronic apparatus of claim 11, further comprising a color filter layer comprising a first filter overlapping the first light emitting element, a second filter overlapping the second light emitting element, and a third filter overlapping the third light emitting element, and on the display element layer, and wherein:

the first filter is to transmit red light;

the second filter is to transmit green light; and the third filter is to transmit blue light.

18. The electronic apparatus of claim 11, wherein:

the first light is blue light;

the second light is red light; and the third light is green light.

19. The electronic apparatus of claim 11, wherein:

one selected from among the first light and the third light is red light, and the other one thereof is green light; and the second light is blue light.

* * * * *